(12) United States Patent
Mizutani et al.

(10) Patent No.: US 7,592,118 B2
(45) Date of Patent: Sep. 22, 2009

(54) POSITIVE RESIST COMPOSITION AND PATTERN FORMING METHOD USING THE SAME

(75) Inventors: Kazuyoshi Mizutani, Shizuoka (JP); Shuji Hirano, Shizuoka (JP); Shinichi Sugiyama, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 11 days.

(21) Appl. No.: 12/053,675

(22) Filed: Mar. 24, 2008

(65) Prior Publication Data

US 2008/0241743 A1 Oct. 2, 2008

(30) Foreign Application Priority Data

Mar. 27, 2007 (JP) ............................. 2007-081504
Jan. 11, 2008 (JP) ............................. 2008-004768

(51) Int. Cl.
*G03F 7/004* (2006.01)
*G03F 7/30* (2006.01)

(52) U.S. Cl. .................... 430/170; 430/270.1; 430/326; 430/905; 430/910

(58) Field of Classification Search ............ 430/270.1, 430/326, 905, 910, 170
See application file for complete search history.

(56) References Cited

U.S. PATENT DOCUMENTS

| 4,910,281 | A * | 3/1990 | Johnson ..................... 528/75 |
| 4,921,930 | A * | 5/1990 | Johnson ..................... 528/306 |
| 6,359,069 | B1 * | 3/2002 | Moulinie et al. ........... 525/148 |
| 6,656,660 | B1 * | 12/2003 | Urano et al. ............. 430/270.1 |
| 2007/0073003 | A1 * | 3/2007 | Sheehan et al. ........... 525/327.1 |

FOREIGN PATENT DOCUMENTS

| JP | 7-84364 | A | 3/1995 |
| JP | 7-316268 | A | 12/1995 |
| JP | 7-319155 | A | 12/1995 |
| JP | 10-186647 | A | 7/1998 |
| JP | 2000-284482 | A | 10/2000 |
| JP | 2006-328241 | A | 12/2006 |

\* cited by examiner

*Primary Examiner*—John S Chu
(74) *Attorney, Agent, or Firm*—Sughrue Mion, PLLC

(57) ABSTRACT

A positive resist composition, includes: (B) a resin containing a repeating unit represented by formula (Ia) or (Ib) as defined in the specification, which decomposes under an action of an acid to increase a solubility of the resin (B) in an aqueous alkali solution; and (A) a compound capable of generating an acid upon irradiation with actinic rays or radiation, and a pattern forming method uses the composition.

21 Claims, No Drawings

POSITIVE RESIST COMPOSITION AND PATTERN FORMING METHOD USING THE SAME

BACKGROUND OF THE INVENTION

1. Field of the Invention

The present invention relates to a positive resist composition suitable for use in the ultramicrolithography process such as production of VLSI or high-capacity microchip or in other photofabrication processes, and a pattern forming method using the same. More specifically, the present invention relates to a positive resist composition capable of forming a high-resolution pattern by using KrF excimer laser light, electron beam, EUV light or the like, and a pattern forming method using the same. That is, the present invention relates to a positive resist composition suitably usable for fine processing of a semiconductor device, where KrF excimer laser light, electron beam or EUV light is used, and a pattern forming method using the same.

2. Description of the Related Art

In the process of producing a semiconductor device such as IC and LSI, fine processing by lithography using a photoresist composition has been conventionally performed. Recently, the integration degree of an integrated circuit is becoming higher and formation of an ultrafine pattern in the sub-micron or quarter-micron region is required. To cope with this requirement, the exposure wavelength also tends to become shorter, for example, from g line to i line or further to KrF excimer laser light. At present, other than the excimer laser light, development of lithography using electron beam, X ray or EUV light is proceeding.

In the lithography involving an ion injection step using KrF excimer laser light, it is also an important problem to satisfy high resolution, good defocus latitude depended on line pitch and the like all at the same time, and this problem needs to be solved.

In regard to the resist suitable for the lithography process used in the ion injection step, as described in JP-A-7-84364 (the term "JP-A" as used herein means an "unexamined published Japanese patent application"), JP-A-7-316268, JP-A-7-319155, JP-A-10-186647, JP-A-2006-328241 and JP-A-2000-284482), studies are being made on a chemical amplification-type resist where light transmittance of the resist film is adjusted from the standpoint of controlling the resist pattern profile on a high-reflection substrate, and in the case of a positive resist, a chemical amplification-type resist composition comprising, as main components, a phenolic polymer insoluble or sparingly soluble in an alkali developer but becoming soluble in an alkali developer under the action of an acid (hereinafter, simply referred to as a "phenolic acid-decomposable resin), an acid generator, and a coloring matter for adjusting the light transmittance is supposed to be effective. There is also known a case where the coloring matter for adjusting the light transmittance is connected to a phenolic acid-decomposable resin. With respect to the coloring matter for adjusting the light transmittance, an anthracene structure, a benzenecarboxylic acid structure, a naphthalenecarboxylic acid structure, a thiophene structure and the like are known.

However, by any combination of these techniques, it is impossible at present to satisfy the performances in terms of high resolution, scumming, iso-dense bias and stationary wave reduction in the ultrafine region.

SUMMARY OF THE INVENTION

An object of the present invention is to solve the problems in the technology for enhancing the performance at fine processing of a semiconductor device, where actinic ray or radiation, particularly, KrF excimer laser light, electron beam or EUV light, is used, and provide a positive resist composition satisfying the performances in terms of high resolution, scumming, iso-dense bias and stationary wave reduction even in an ultrafine region, particularly, in an ion injection step not using an antireflection film (BARC), and a pattern forming method using the composition.

As a result of intensive studies to attain the above-described object, the present inventors have accomplished the present invention.

The present invention is as follows.

(1) A positive resist composition, comprising:

(B) a resin containing a repeating unit represented by formula (Ia) or (Ib), which decomposes under an action of an acid to increase a solubility of the resin (B) in an aqueous alkali solution; and (A) a compound capable of generating an acid upon irradiation with actinic rays or radiation:

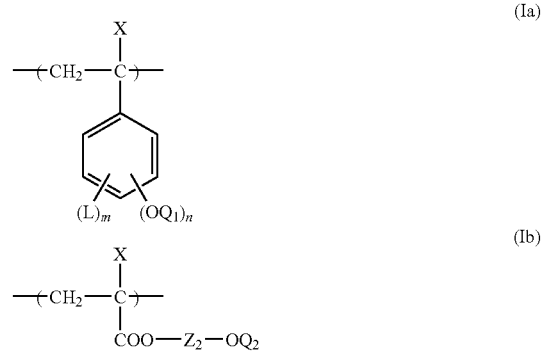

wherein in formula (Ia), X represents a hydrogen atom, a methyl group or a halogen atom;

$Q_1$ represents an arylcarbonyl group, and when n is 2 or 3, a plurality of $Q_1$'s may be the same or different;

L represents a monovalent organic group, a halogen atom, a cyano group or a nitro group, and when m is 2, two L's may be the same or different;

n represents an integer of 1 to 3; and m represents an integer of 0 to 2, and in formula (Ib), X represents a hydrogen atom, a methyl group or a halogen atom;

$Q_2$ represents an arylcarbonyl group; and $Z_2$ represents a divalent linking group.

(2) The positive resist composition as described in (1) above, wherein the resin (B) further contains a repeating unit represented by formula (II):

wherein Y represents a hydrogen atom, a methyl group, a halogen atom, a cyano group, a hydroxymethyl group, an alkoxymethyl group or an acyloxymethyl group; and A presents a group which leaves under an action of an acid.

(3) The positive resist composition as described in (1) or (2) above, wherein the resin (B) further contains a repeating unit represented by formula (III):

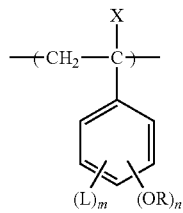

(III)

wherein X represents a hydrogen atom, a methyl group or a halogen atom;

R represents a hydrogen atom or a group which leaves under an action of an acid;

L represents a monovalent organic group, a halogen atom, a cyano group or a nitro group;

n represents an integer of 1 to 3; and m represents an integer of 0 to 2.

(4) The positive resist composition as described in any of (1) to (3) above, wherein the resin (B) further contains a repeating unit represented by formula (IV):

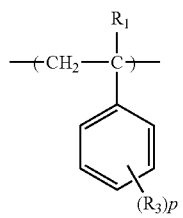

(IV)

wherein $R_1$ represents a hydrogen atom, an alkyl group, a cyano group or a halogen atom;

$R_3$ represents a monovalent organic group not having a property of decomposing under an action of an acid, or represents a halogen atom or a nitro group; and p represents an integer of 0 to 5, and when p is an integer of 2 or more, a plurality of $R_3$'s may be the same or different.

(5) The positive resist composition as described in any of (1) to (4) above, wherein the compound (A) capable of generating an acid upon irradiation with actinic rays or radiation is a diazosulfone or an oxime ester.

(6) The positive resist composition as described in any of (1) to (4) above, wherein the compound (A) capable of generating an acid upon irradiation with actinic rays or radiation is a sulfonium salt having bis(alkylsulfonyl)amide anion or tris(alkylsulfonyl)methide anion.

(7) The positive resist composition as described in any of (1) to (6) above, wherein the repeating unit represented by formula (Ia) or (Ib) in the resin (B) has a content of from 5 to 15 mol % based on all repeating units in the resin (B).

(8) A pattern forming method, comprising:

forming a resist film from the positive resist composition as described in any of (1) to (7) above; and exposing and developing the resist film.

DETAILED DESCRIPTION OF THE INVENTION

The present invention is described in detail below.

Incidentally, in the context of the present invention, when a group (atomic group) is denoted without specifying whether substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

(B) Resin having a repeating unit represented by formula (Ia) or (Ib), which decomposes under the action of an acid to increase the solubility in an aqueous alkali solution The positive resist composition of the present invention comprises a resin having a repeating unit represented by the following formula (Ia) or (Ib), which decomposes under the action of an acid to increase the solubility in an aqueous alkali solution (hereinafter sometimes referred to as a "resin (B)").

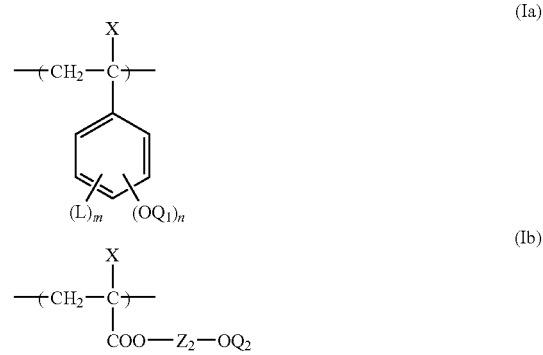

In formula (Ia), X represents a hydrogen tom, a methyl group or a halogen atom.

$Q_1$ represents an arylcarbonyl group, and when n is 2 or 3, the plurality of $Q_1$'s may be the same or different.

L represents a monovalent organic group, a halogen atom, a cyano group or a nitro group, and when m is 2, two L's may be the same or different.

n represents an integer of 1 to 3.

m represents an integer of 0 to 2.

In formula (Ib), X represents a hydrogen atom, a methyl group or a halogen atom.

$Q_2$ represents an arylcarbonyl group.

$Z_2$ represents a divalent linking group.

In formulae (Ia) and (Ib), the aryl group in the arylcarbonyl group of $Q_1$ and $Q_2$ is preferably an aryl group having a carbon number of 6 to 20, more preferably a phenyl group, a naphthyl group or an anthranyl group. The aryl group may have a substituent, and examples of the substituent include an alkyl group, an aralkyl group, an aryl group, an acyl group, an alkoxy group, an acyloxy group, a hydroxyl group, a halogen atom, a cyano group, a nitro group, a carboxylic acid ester group, and a sulfonic acid ester group. The alkyl group is preferably a linear or branched alkyl group having a carbon number of 1 to 20, such as methyl group, ethyl group, propyl group, isopropyl group, n-butyl group, isobutyl group, tert-butyl group, pentyl group, cyclopentyl group, hexyl group, cyclohexyl group, octyl group and dodecyl group. The aralkyl group is preferably an aralkyl having a carbon number of 7 to 20, such as benzyl group, phenethyl group and naphthylmethyl group. The aryl group is preferably an aryl group having a carbon number of 6 to 20, such as phenyl group, naphthyl group and anthranyl group.

Examples of the monovalent organic group of L include an alkyl group, an aralkyl group, an aryl group, an acyl group, an alkoxy group and an acyloxy group.

Specific examples of the divalent linking group of $Z_2$ include an alkylene group, an aralkylene group, an arylene group, a divalent heterocyclic group, an ether group, an ester group, an amido group, a urethane group, a ureido group and a sulfide group, and a combination of a plurality of these groups may also be used. A group having an alkylene group, an aralkylene group or an arylene group is preferred, and a group having an alkylene group, an aralkylene group or an arylene group is more preferred. The alkylene group is preferably an alkylene group having a carbon number of 1 to 10, the aralkylene group is preferably an aralkylene group having a carbon number of 7 to 20, and the arylene group is preferably an arylene group having a carbon number of 6 to 20. The hetero ring of the divalent heterocyclic group is preferably a furan ring or a thiophene group.

The halogen atom includes a fluorine atom, a chlorine atom, a bromine atom and an iodine atom and is preferably a fluorine atom.

Specific examples of the repeating units represented by formulae (Ia) and (Ib) are set forth below, but the present invention is not limited thereto.

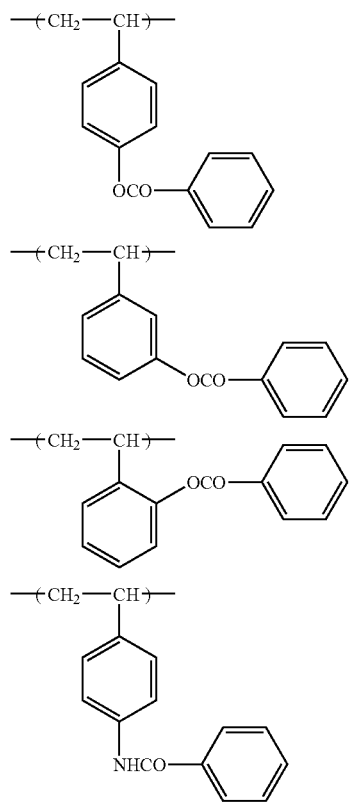

-continued

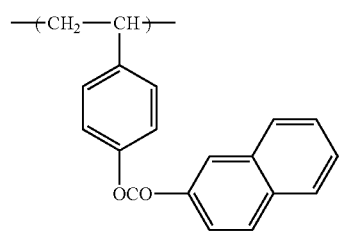

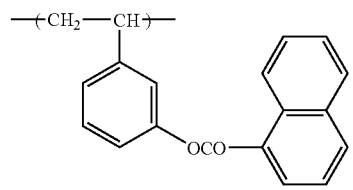

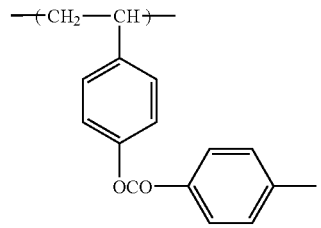

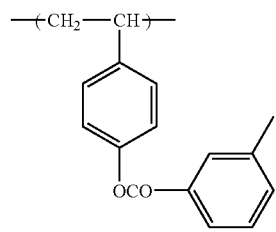

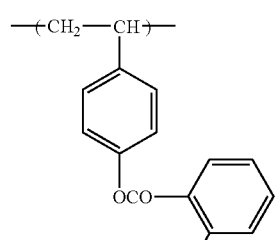

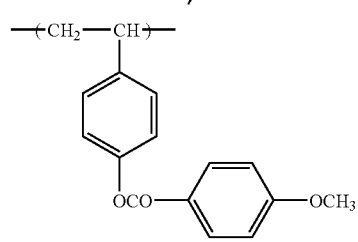

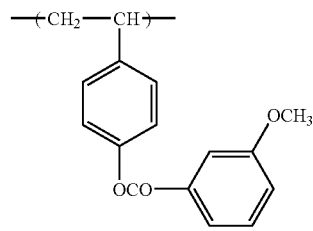

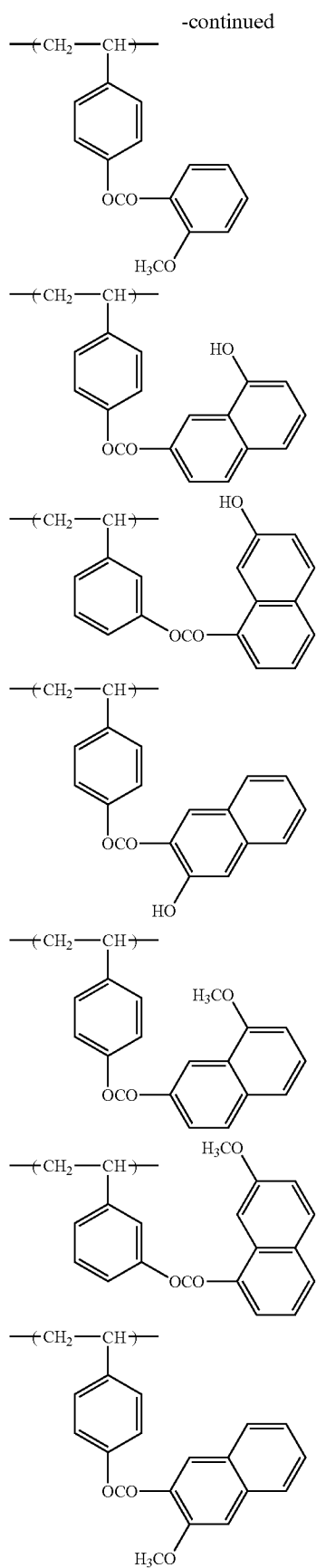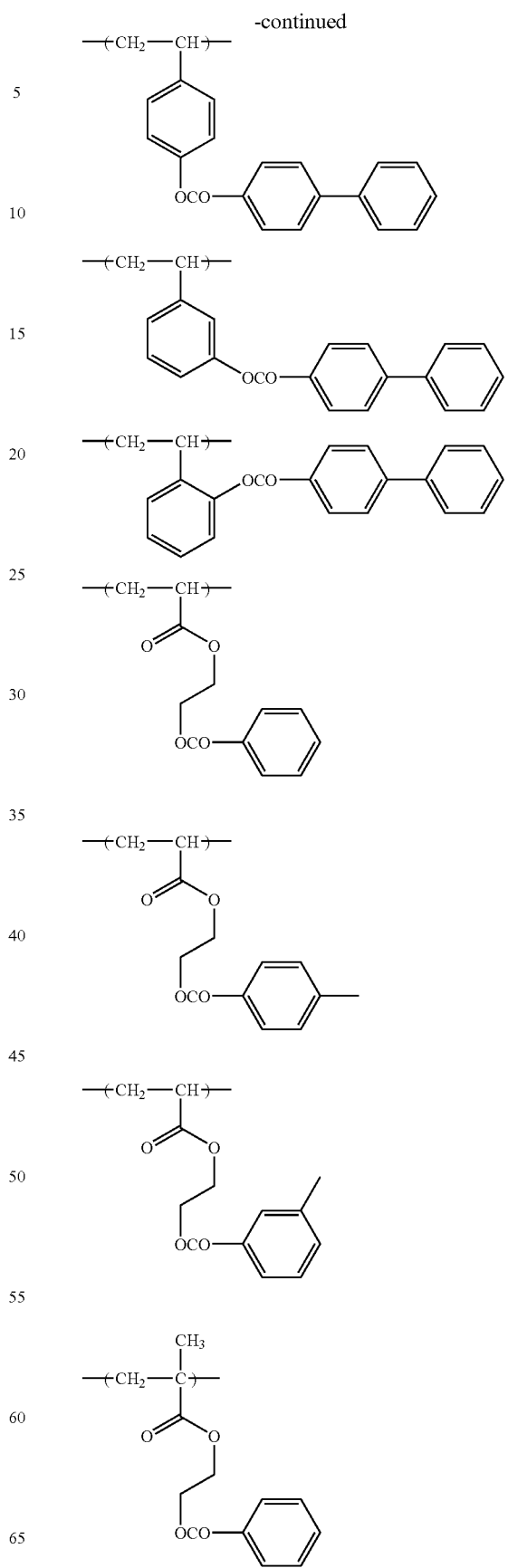

-continued
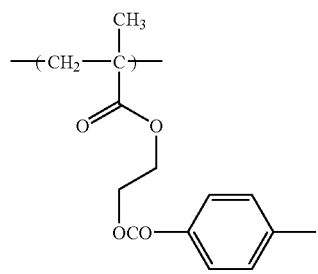
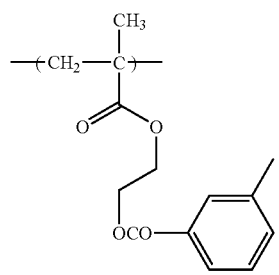
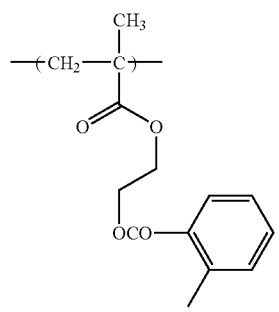
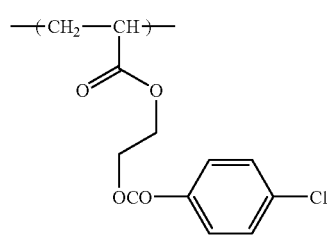
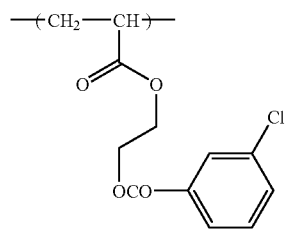
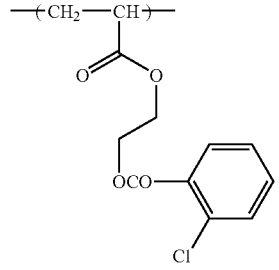
-continued
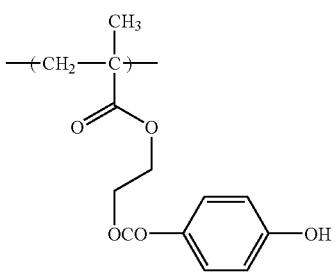
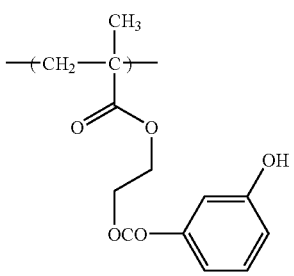
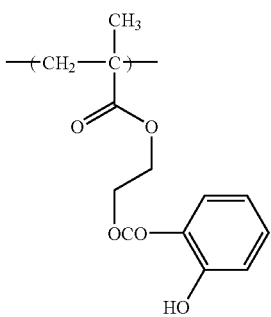
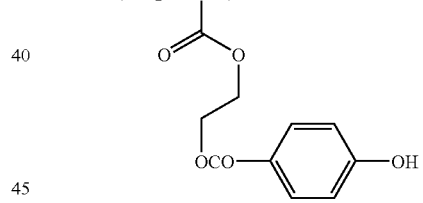
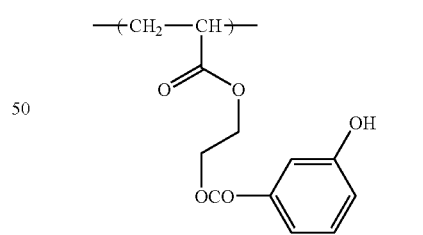
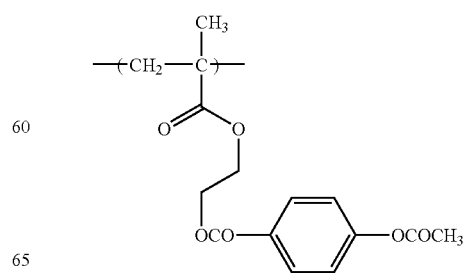

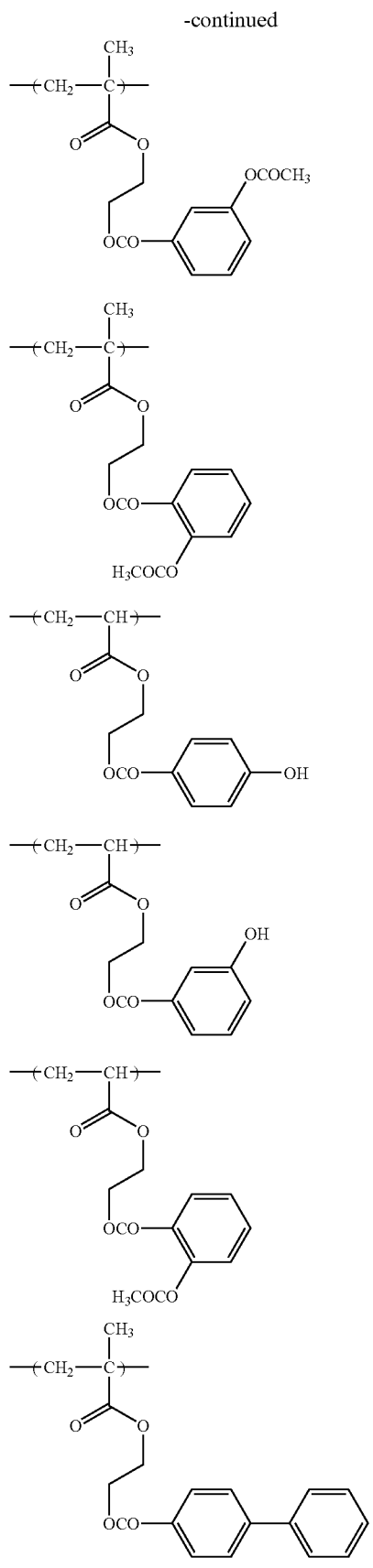
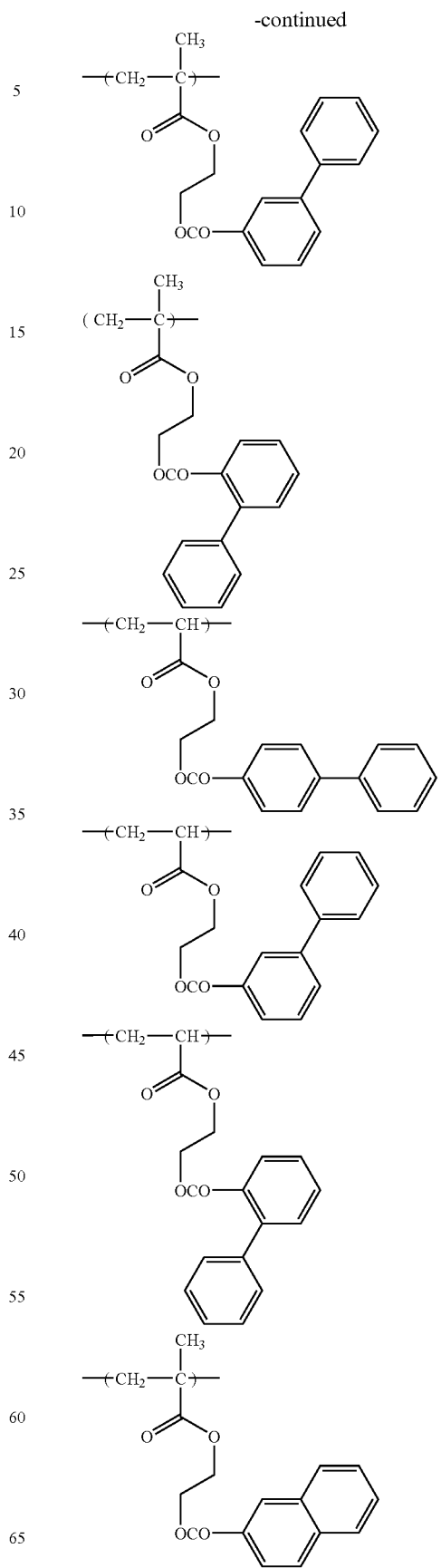

-continued
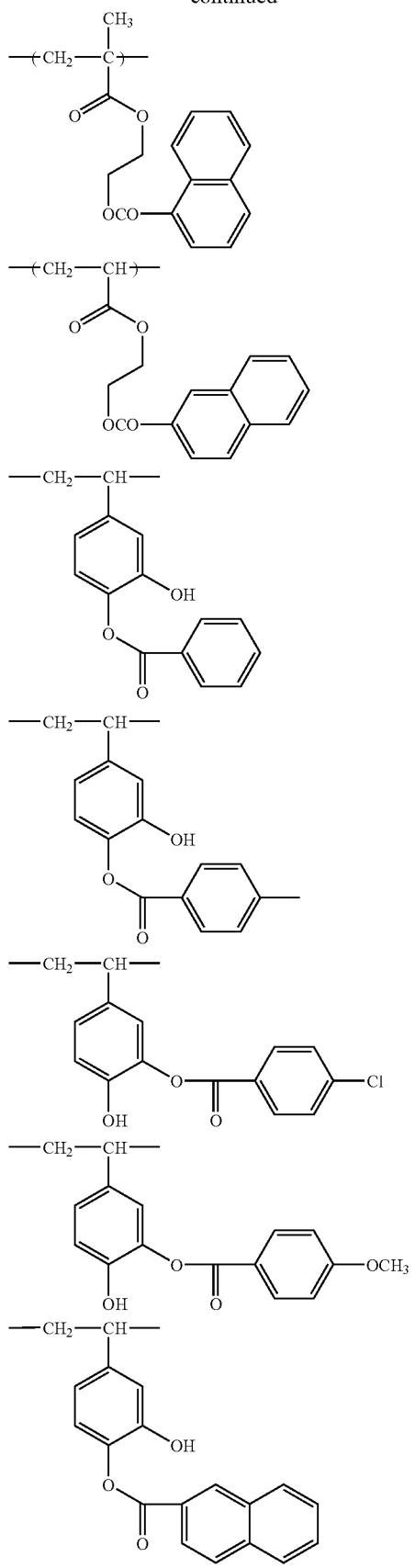
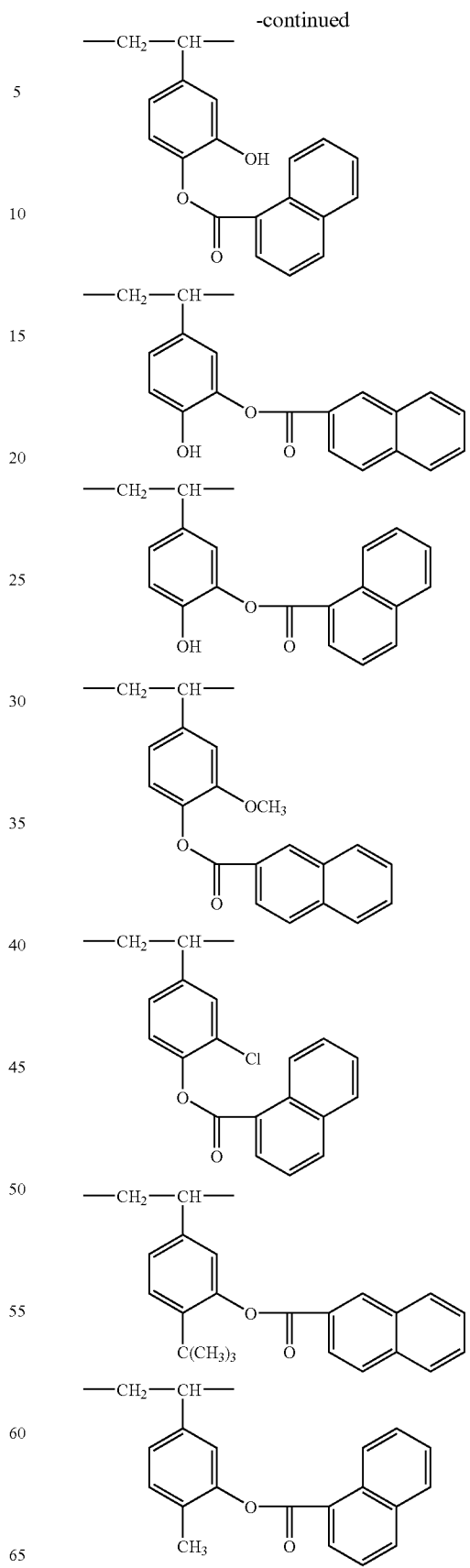

The resin (B) preferably further has a repeating unit represented by the following formula (II) or (III).

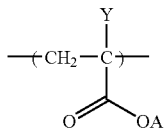
(II)

In formula (II), Y represents a hydrogen atom, a methyl group, a halogen atom, a cyano group, a hydroxymethyl group, an alkoxymethyl group or an acyloxymethyl group.

A presents a group which leaves under the action of an acid.

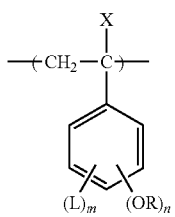
(III)

In formula (III), X represents a hydrogen atom, a methyl group or a halogen atom.

R represents a hydrogen atom or a group which leaves under the action of an acid.

L represents a monovalent organic group, a halogen atom, a cyano group or a nitro group.

n represents an integer of 1 to 3.

m represents an integer of 0 to 2.

In formula (II), the group which leaves under the action of an acid, of A, is preferably a hydrocarbon group (preferably having a carbon number of 20 or less, more preferably from 4 to 12), more preferably a tert-butyl, a tert-amyl group, or an alicyclic or aromatic ring-containing hydrocarbon group (for example, an alicyclic group itself or a group where an alicyclic group is substituted to an alkyl group).

The alicyclic structure may be either monocyclic or polycyclic. Specific examples thereof include a monocyclo, bicyclo, tricyclo or tetracyclo structure having a carbon number of 5 or more. The carbon number of the alicyclic structure is preferably from 6 to 30, more preferably from 7 to 25. The alicyclic structure-containing hydrocarbon group may have a substituent.

In the present invention, the preferred alicyclic structure includes, as denoted in terms of the monovalent alicyclic structure, an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group and a cyclododecanyl group. Among these, an adamantyl group, a decalin residue, a norbornyl group, a cedrol group, a cyclohexyl group, a cycloheptyl group, a cyclooctyl group, a cyclodecanyl group and a cyclododecanyl group are more preferred.

The substituent which the alicyclic ring in these alicyclic groups may have includes an alkyl group, a halogen atom, a hydroxyl group, an alkoxy group, a carboxyl group, and an alkoxycarbonyl group. The alkyl group is preferably a lower alkyl group such as methyl group, ethyl group, propyl group, isopropyl group and butyl group, more preferably a methyl group, an ethyl group, a propyl group or an isopropyl group.

The alkoxy group includes an alkoxy group having a carbon number of 1 to 4, such as methoxy group, ethoxy group, propoxy group and butoxy group. The alkyl group and alkoxy group each may further have a substituent. The substituent which the alkyl group and alkoxy group each may further have includes a hydroxyl group, a halogen atom and an alkoxy group.

The alicyclic structure-containing group which leaves under the action of an acid is preferably a group represented by any one of the following formulae (pI) to (pV).

(pI)

(pII)

(pIII)

(pIV)

(pV)

In formulae (pI) to (pV), $R_{11}$ represents a methyl group, an ethyl group, an n-propyl group, an isopropyl group, an n-butyl group, an isobutyl group or a sec-butyl group.

Z represents an atomic group necessary for forming an alicyclic hydrocarbon group together with the carbon atom.

$R_{12}$ to $R_{16}$ each independently represents a linear or branched alkyl group having a carbon number of 1 to 4 or an alicyclic hydrocarbon group, provided that at least one of $R_{12}$ to $R_{14}$, or either $R_{15}$ or $R_{16}$, represents an alicyclic hydrocarbon group.

$R_{17}$ to $R_{21}$ each independently represents a hydrogen atom, a linear or branched alkyl group having a carbon number of 1 to 4, or an alicyclic hydrocarbon group, provided that at least one of $R_{17}$ to $R_{21}$ represents an alicyclic hydrocarbon group and at least either $R_{19}$ or $R_{21}$ represents a linear or branched alkyl group having a carbon number of 1 to 4 or an alicyclic hydrocarbon group.

$R_{22}$ to $R_{25}$ each independently represents a hydrogen atom, a linear or branched alkyl group having a carbon number of 1 to 4, or an alicyclic hydrocarbon group, provided that at least one of $R_{22}$ to $R_{25}$ represents an alicyclic hydrocarbon group. $R_{23}$ and $R_{24}$ may combine with each other to form a ring.

In formulae (pI) to (pV), examples of the alkyl group of $R_{12}$ to $R_{25}$ include a methyl group, an ethyl group, an n-propyl group, an isopropyl group, an n-butyl group, an isobutyl group, a sec-butyl group and a tert-butyl group.

Examples of the substituent which the alkyl group may further have include an alkoxy group having a carbon number of 1 to 4, a halogen atom (fluorine, chlorine, bromine, iodine), an acyl group, an acyloxy group, a cyano group, a hydroxyl group, a carboxy group, an alkoxycarbonyl group, and a nitro group.

The alicyclic hydrocarbon group of $R_{12}$ to $R_{25}$ or the alicyclic hydrocarbon group formed by Z together with the carbon atom includes those described above as the alicyclic structure.

Specific examples of the alicyclic structure-containing group which leaves under the action of an acid, as A, are set forth below, but the present invention is not limited thereto.

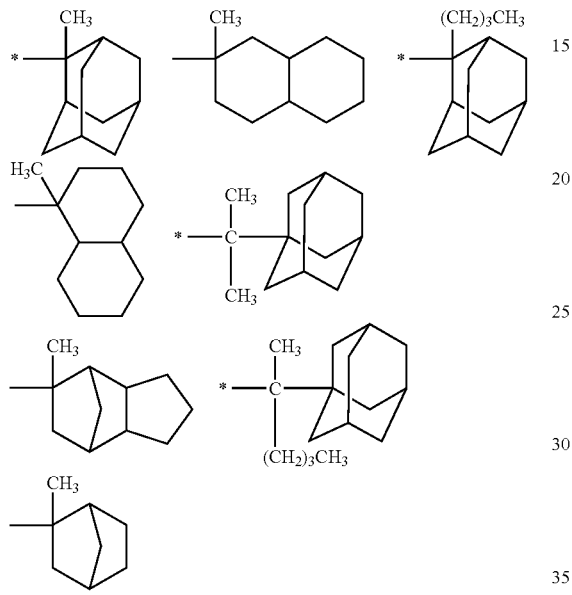

The aromatic group-containing group which leaves under the action of an acid is preferably a group represented by the following formulae (pVI).

(pVI)

In formula (pVI), $R_{26}$ represents an alkyl group.
$R_{27}$ represents an aryl group.

The alkyl group of $R_{26}$ is the same as the alkyl group in $R_{12}$ to $R_{25}$.

The aryl group of $R_{27}$ is preferably an aryl group having a carbon number of 6 to 14, more preferably a phenyl group or a naphthyl group, and may have a substituent such as alkyl group, aralkyl group, halogen atom, nitro group, cyano group, hydroxy group, alkoxy group, acyl group and acyloxy group.

The monomer corresponding to the repeating unit represented by formula (II) can be synthesized by esterifying a (meth)acrylic acid chloride and an alcohol compound in a solvent such as THF, acetone and methylene chloride, in the presence of a basic catalyst such as triethylamine, pyridine and DBU. A commercially available product may also be used.

Specific examples of the repeating unit represented by formula (II) or the polymerizable monomer corresponding to the repeating unit represented by formula (II) are set forth below, but the present invention is not limited thereto.

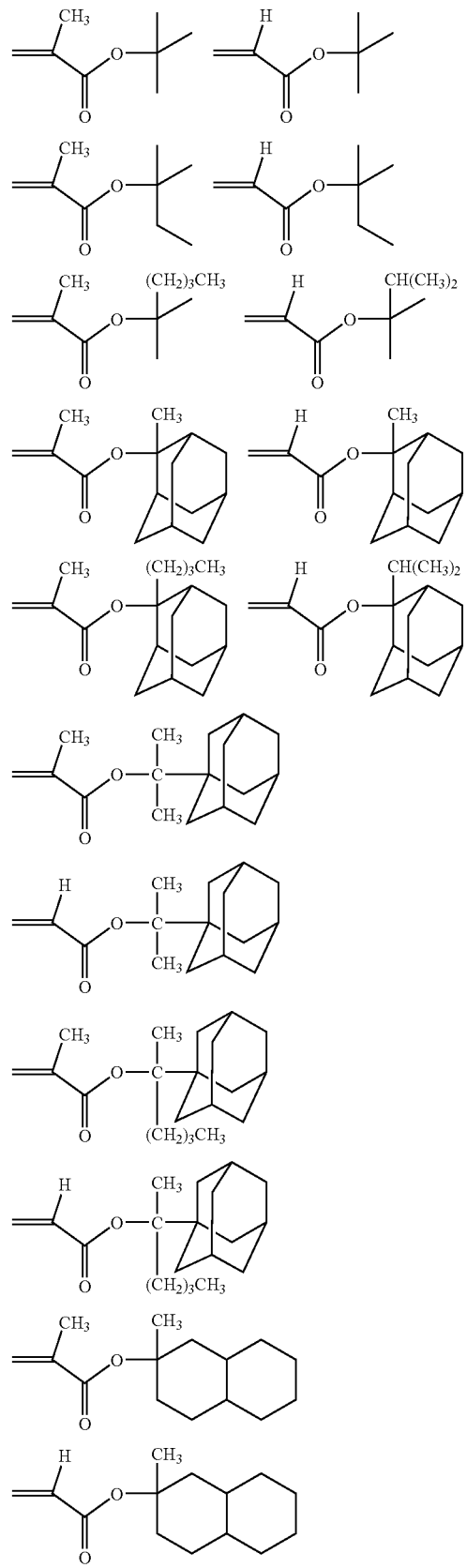

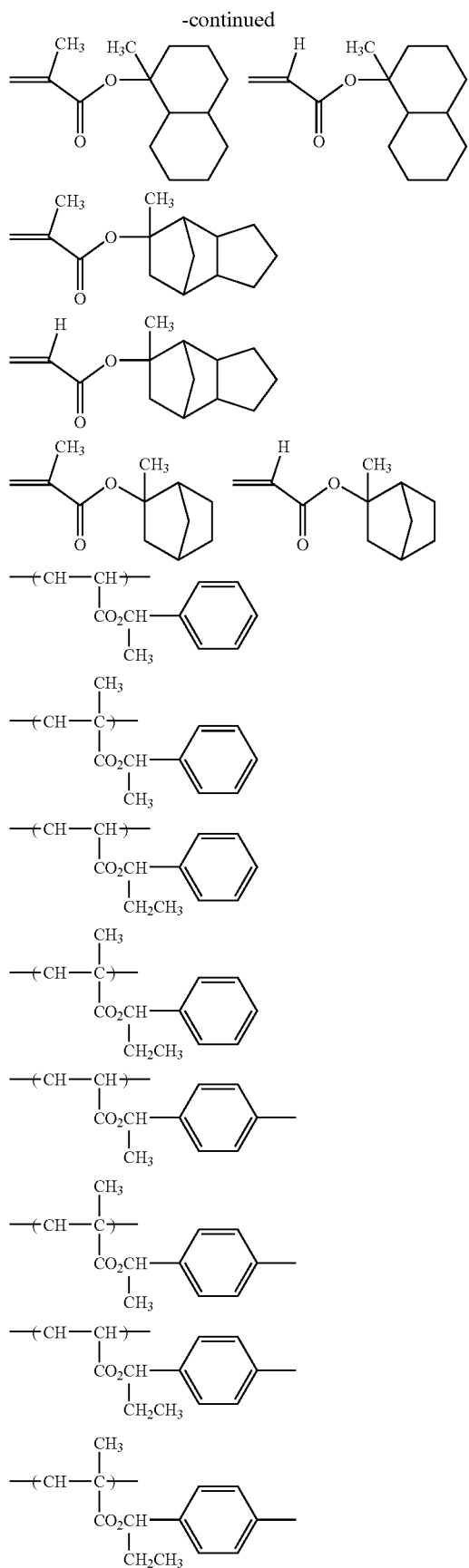

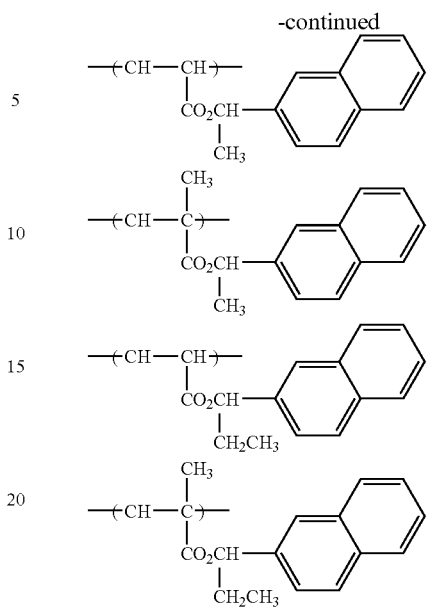

L in formula (III) is the same as L in formula (Ia).

In formula (III), the group which leaves under the action of an acid of R includes, specifically, a tertiary alkyl group such as tert-butyl group and tert-amyl group, a tert-butoxycarbonyl group, a tert-butoxycarbonylmethyl group and an acetal group as represented by —$C(L_1)(L_2)$—O—Z.

$L_1$ and $L_2$, which may be the same or different, each represents a hydrogen atom, an alkyl group, a cycloalkyl group or an aralkyl group.

Z represents an alkyl group, a cycloalkyl group or an aralkyl group.

Z and $L_1$ may combine with each other to form a 5- or 6-membered ring.

The alkyl group of $L_1$, $L_2$ and Z is preferably a linear or branched alkyl group having a carbon number of 1 to 20, such as methyl group, ethyl group, propyl group, isopropyl group, n-butyl group, isobutyl group, tert-butyl group, pentyl group, hexyl group, octyl group and dodecyl group.

The cycloalkyl group of $L_1$, $L_2$ and Z is preferably a cycloalkyl group having a carbon number of 3 to 20, such as cyclopropyl group, cyclobutyl group, cyclopentyl group and cyclohexyl group.

The aralkyl group in $L_1$, $L_2$ and Z includes an aralkyl group having a carbon number of 7 to 15, such as benzyl group and phenethyl group.

These groups each may have a substituent, and preferred examples of the substituent which these groups each may have include an alkyl group, a cycloalkyl group, an aryl group, an alkoxy group, a cycloalkoxy group, an aryloxy group, a hydroxyl group, a halogen atom, a nitro group, an acyl group, an acyloxy group, an acylamino group, a sulfonylamino group, an alkylthio group, an arylthio group, an aralkylthio group, a thiophenecarbonyloxy group, a thiophenemethylcarbonyloxy group, and a pyrrolidone residue.

Examples of the 5- or 6-membered ring formed by combining Z and $L_1$ with each other include a tetrahydropyran ring and a tetrahydrofuran ring.

In the present invention, Z is preferably a linear or branched alkyl group. By virtue of this construction, the effect of the present invention is brought out more prominently.

The monomer corresponding to the repeating unit represented by formula (III) may be synthesized by acetalizing a hydroxy-substituted styrene monomer and a vinyl ether compound in a solvent such as THF and methylene chloride, in the presence of an acidic catalyst such as p-toluenesulfonic acid and pyridine p-toluenesulfonate, or by effecting tert-Boc protection using tert-butyl dicarboxylate in the presence of a basic catalyst such as triethylamine, pyridine and DBU. A commercially available product may also be used.

Specific examples of the repeating unit represented by formula (III) are set forth below, but the present invention is not limited thereto.

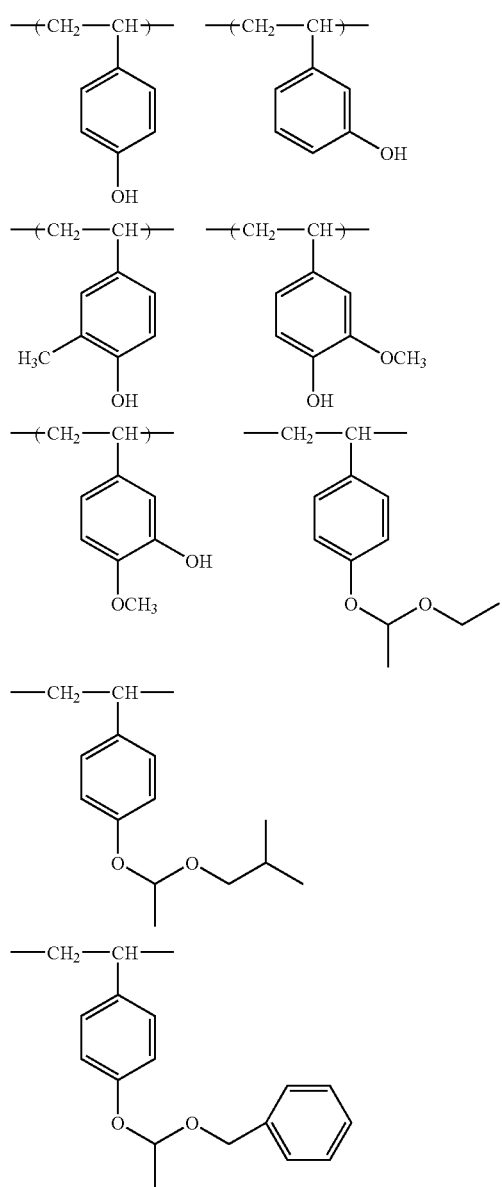

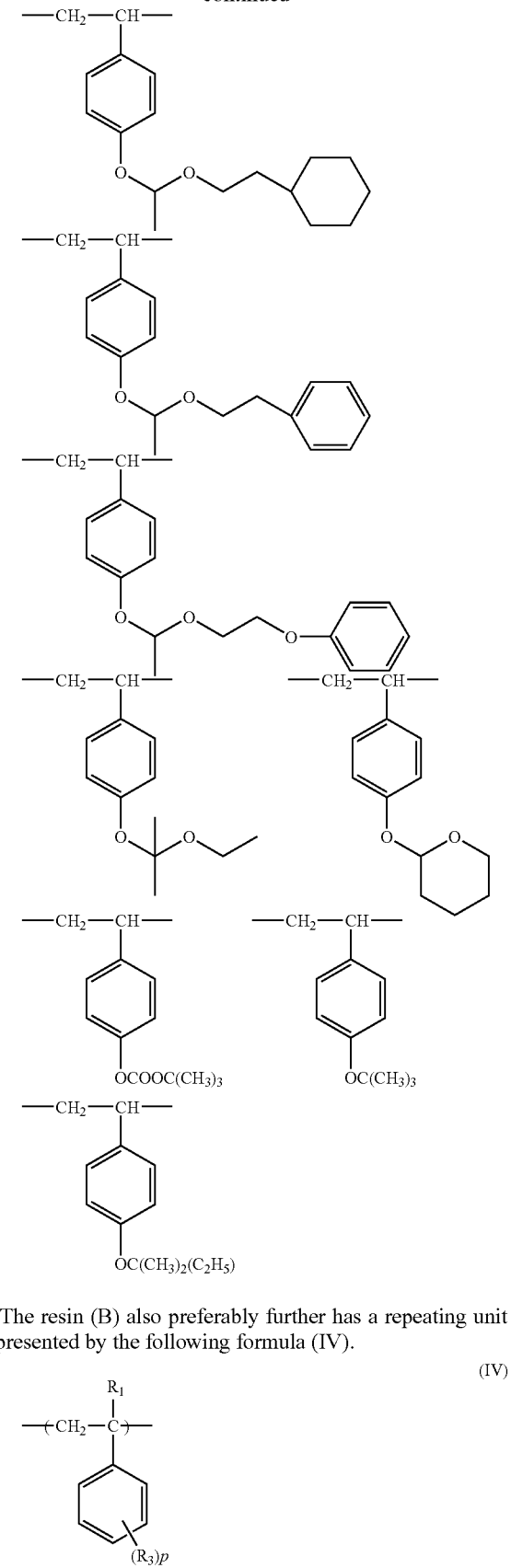

The resin (B) also preferably further has a repeating unit represented by the following formula (IV).

(IV)

In formula (IV), $R_1$ represents a hydrogen atom, an alkyl group, a cyano group or a halogen atom.

$R_3$ represents a monovalent organic group not having a property of decomposing under the action of an acid, or represents a halogen atom or a nitro group.

p represents an integer of 0 to 5, and when p is an inter of 2 or more, the plurality of $R_3$'s may be the same or different.

In formula (IV), the alkyl group of $R_1$ is preferably a linear alkyl group having a carbon number of 1 to 4 and may be substituted by a halogen atom (preferably fluorine atom), a hydroxyl group or the like.

Specific examples of the monovalent organic group not having a property of decomposing under the action of an acid (sometimes referred to as an acid-stable group) include an alkyl group, a cycloalkyl group, an aryl group, an alkenyl group, a cyano group, an alkyloxy group, a cycloalkyloxy group, an alkenyloxy group, an aryloxy group, an alkylcarbonyloxy group, a cycloalkylcarbonyloxy group, an arylcarbonyloxy group, an alkylamidomethyloxy group, an alkylamide group, an arylamidomethyl group, and an arylamide group.

Specific examples of the repeating unit represented by formula (IV) are set forth below, but the present invention is not limited thereto.

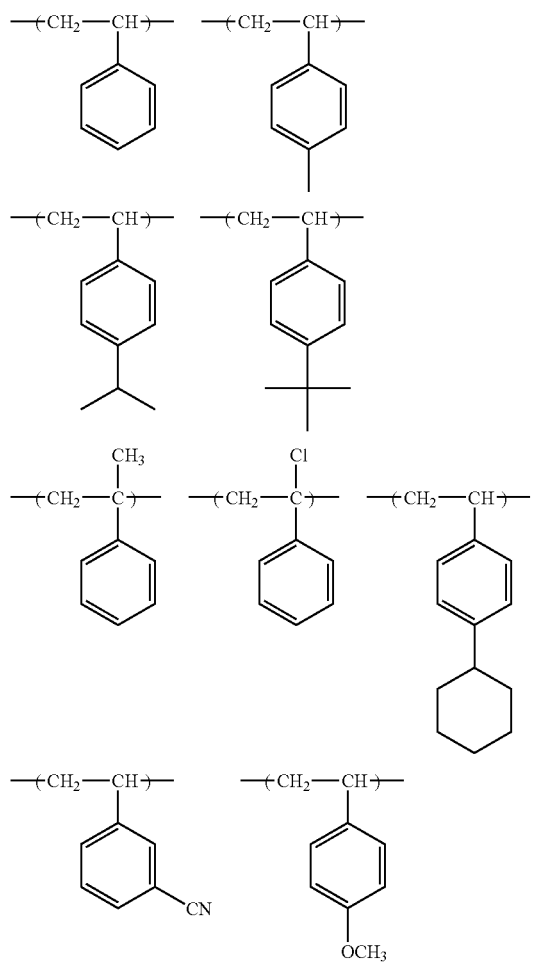

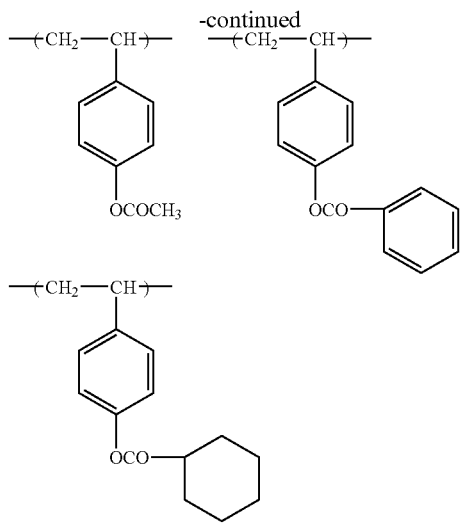

The resin (B) is preferably a resin of which solubility in an alkali developer increases under the action of an acid (acid-decomposable resin), and preferably contains, in an arbitrary repeating unit, a group capable of decomposing under the action of an acid to produce an alkali-soluble group (acid-decomposable group).

The resin may contain the acid-decomposable group in the repeating unit represented by formula (II) or (III) or in other repeating units.

Examples of the acid-decomposable group include a group represented by —C(=O)—$X_1$—$R_0$.

In the formula above, $R_0$ represents, for example, a tertiary alkyl group such as tert-butyl group and tert-amyl group, a 1-alkoxyethyl group such as isobornyl group, 1-ethoxyethyl group, 1-butoxyethyl group, 1-isobutoxyethyl group and 1-cyclohexyloxyethyl group, an alkoxymethyl group such as 1-methoxymethyl group and 1-ethoxymethyl group, a 3-oxoalkyl group, a tetrahydropyranyl group, a tetrahydrofuranyl group, a trialkylsilyl ester group, a 3-oxocyclohexyl ester group, a 2-methyl-2-adamantyl group, or a mevalonic lactone group. $X_1$ represents an oxygen atom, a sulfur atom, —NH—, —NHSO$_2$—, or —NHSO$_2$NH—.

The resin (B) may have the repeating units represented by formulae (Ia), (Ib), (II), (III) and (IV) each in combination of two or more kinds thereof.

The content of the repeating unit represented by formula (Ia) or (Ib) in the resin (B) is preferably from 2 to 30 mol %, more preferably from 3 to 20 mol %, still more preferably from 5 to 15 mol %, based on all repeating units.

The content of the repeating unit represented by formula (II) in the resin (B) is preferably from 5 to 60 mol %, more preferably from 5 to 50 mol %, still more preferably from 10 to 35 mol %, based on all repeating units.

The content of the repeating unit represented by formula (III) in the resin (B) is preferably from 40 to 90 mol %, more preferably from 50 to 85 mol %, still more preferably from 60 to 80 mol %, based on all repeating units.

The resin (B) may further has a repeating unit represented by formula (IV), and this is preferred from the standpoint of, for example, enhancing the film quality or reducing the film loss in the unexposed area. The content of the repeating unit represented by formula (IV) is preferably from 0 to 50 mol %, more preferably from 0 to 40 mol %, still more preferably from 0 to 30 mol %, based on all repeating units.

In the resin (B), an appropriate other polymerizable monomer may be copolymerized to introduce an alkali-soluble group such as phenolic hydroxyl group and carboxyl group and thereby maintain good developability with an alkali developer, or a hydrophobic other polymerizable monomer such as alkyl acrylate and alkyl methacrylate may be copolymerized so as to enhance the film quality.

The weight average molecular weight (Mw) of the resin (B) is preferably from 1,000 to 15,000, more preferably from 3,000 to 10,000. The dispersity (Mw/Mn) is preferably from 1.0 to 2.0, more preferably from 1.0 to 1.8, still more preferably from 1.0 to 1.5.

The weight average molecular weight here is defined as a polystyrene-reduced value determined by gel permeation chromatography.

The resin (B) can be obtained by radically or anionically polymerizing a monomer giving the repeating unit (Ia) or (Ib), alone or with another monomer, or by reacting an arylcarboxylic acid halide or arylcarboxylic acid anhydride with a resin where a hydroxystyrene-based monomer is copolymerized.

The resins (B) each may be used in combination of two or more kinds thereof.

The amount of the resin (B) added is, as the total amount, usually from 10 to 96 mass %, preferably from 15 to 96 mass %, more preferably from 20 to 95 mass %, based on the entire solid content of the positive resist composition. (In this specification, mass ratio is equal to weight ratio.)

Specific examples of the resin (B) are set forth below, but the present invention is not limited thereto.

(B-1)
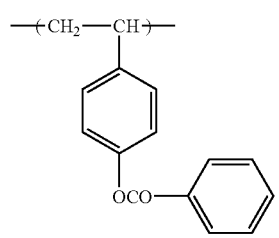 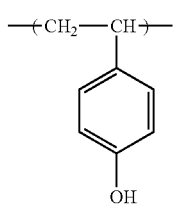
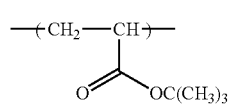

(B-2)
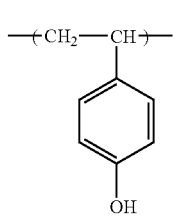
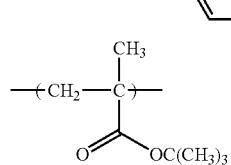

-continued (B-3)
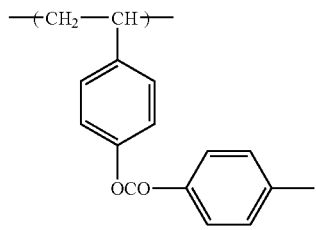 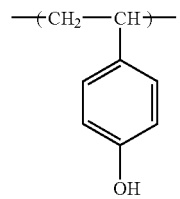
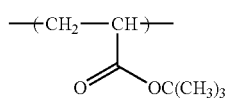

(B-4)
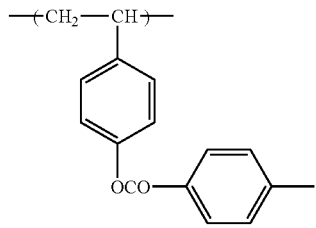 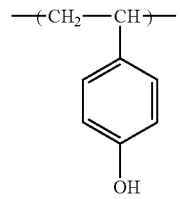

(B-5)
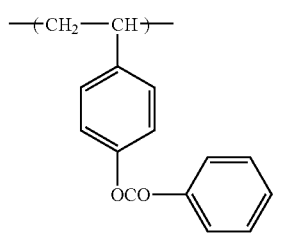
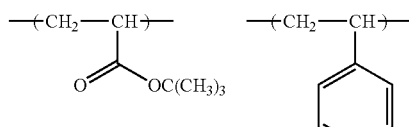

(B-6)
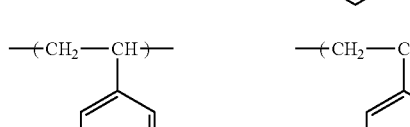
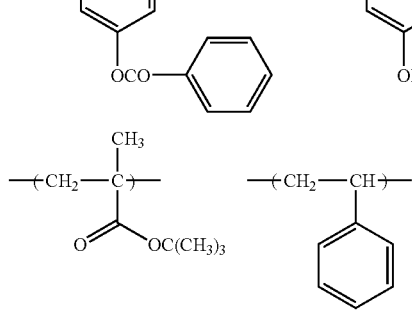

-continued
(B-7)
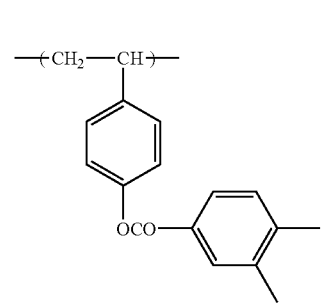
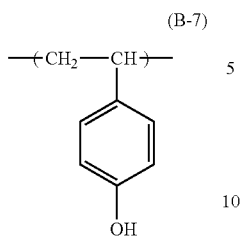
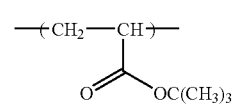
(B-8)
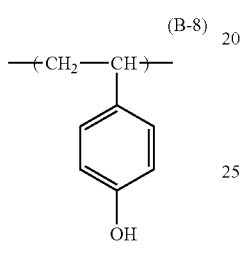
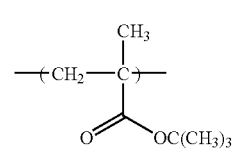
(B-9)
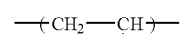
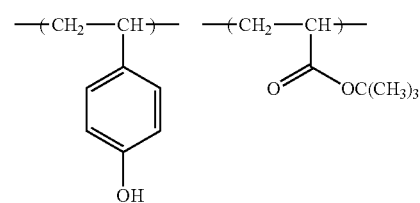
(B-10)
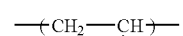
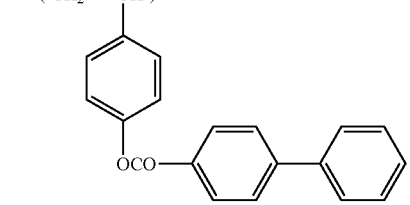
-continued
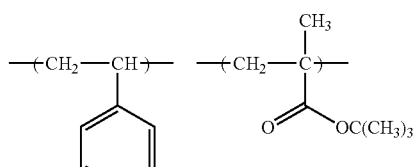
(B-11)
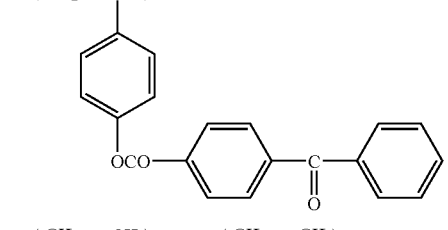
(B-12)
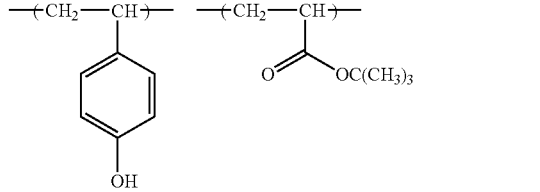
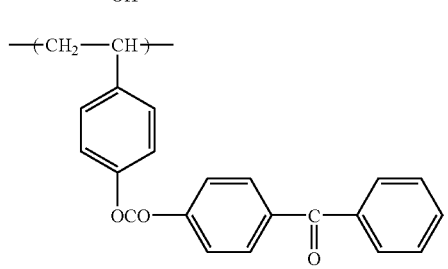
(B-13)
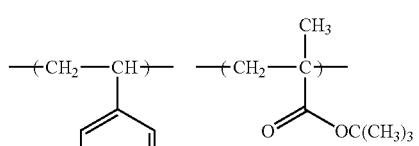
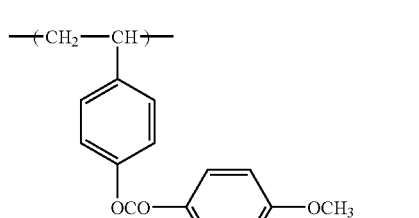
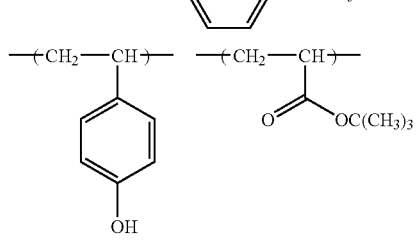

-continued
(B-14)
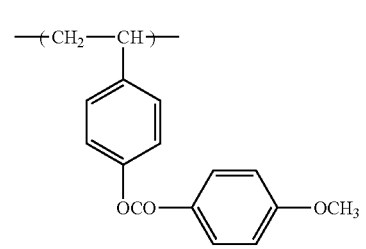
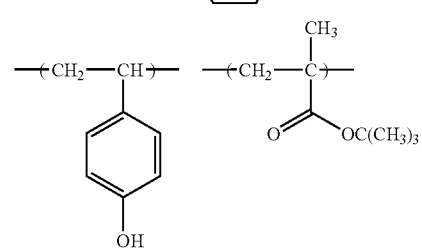
(B-15)
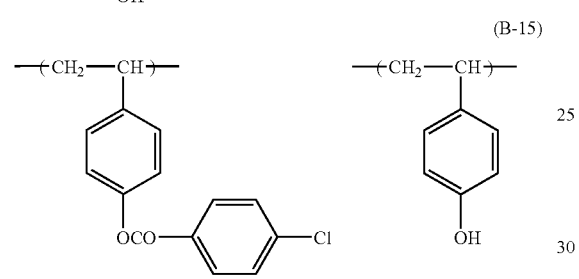
(B-16)
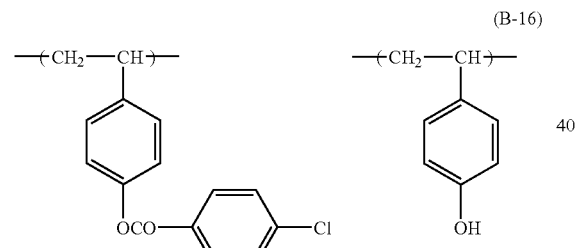
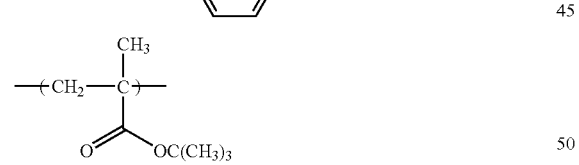
(B-17)
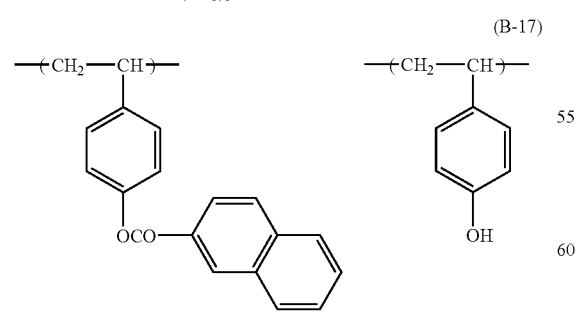
-continued
(B-18)
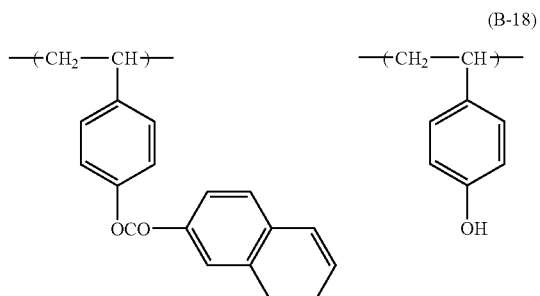
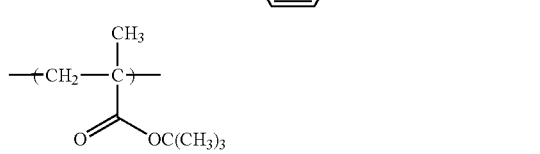
(B-19)
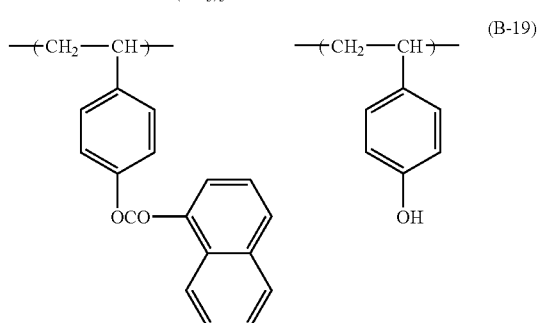
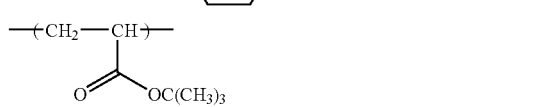
(B-20)
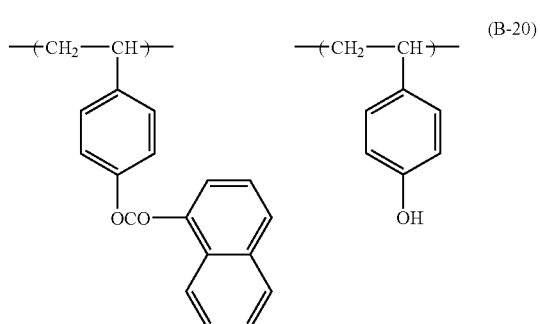
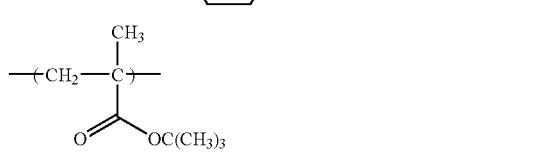
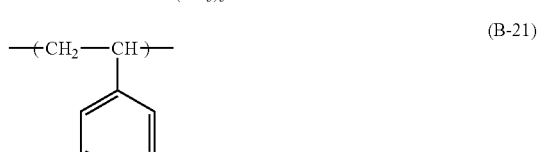
(B-21)
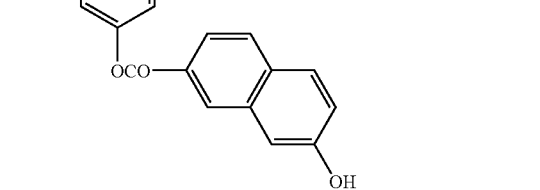

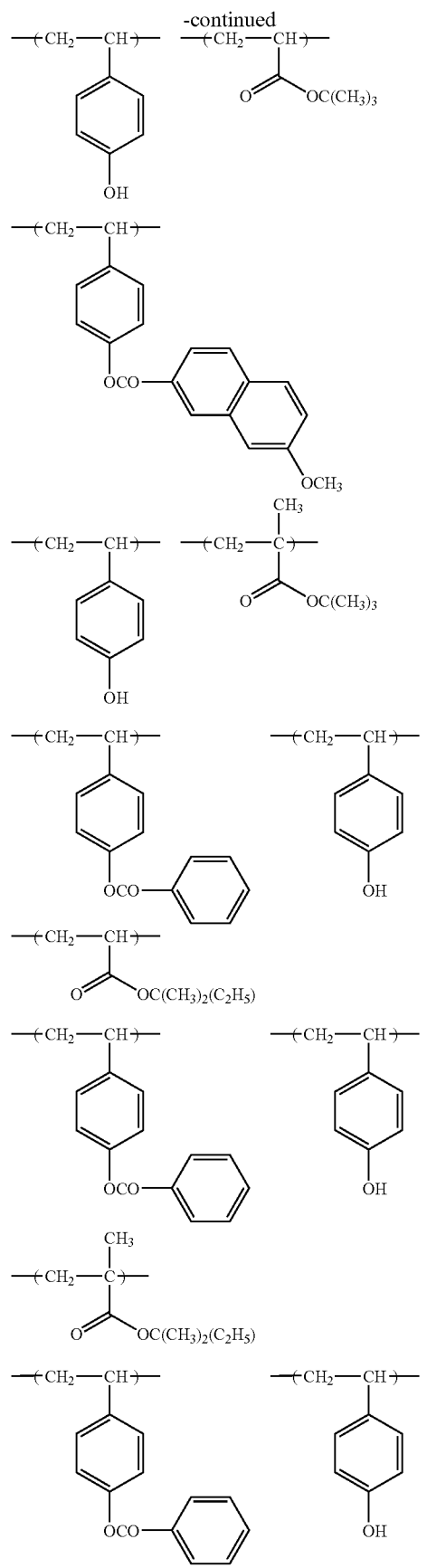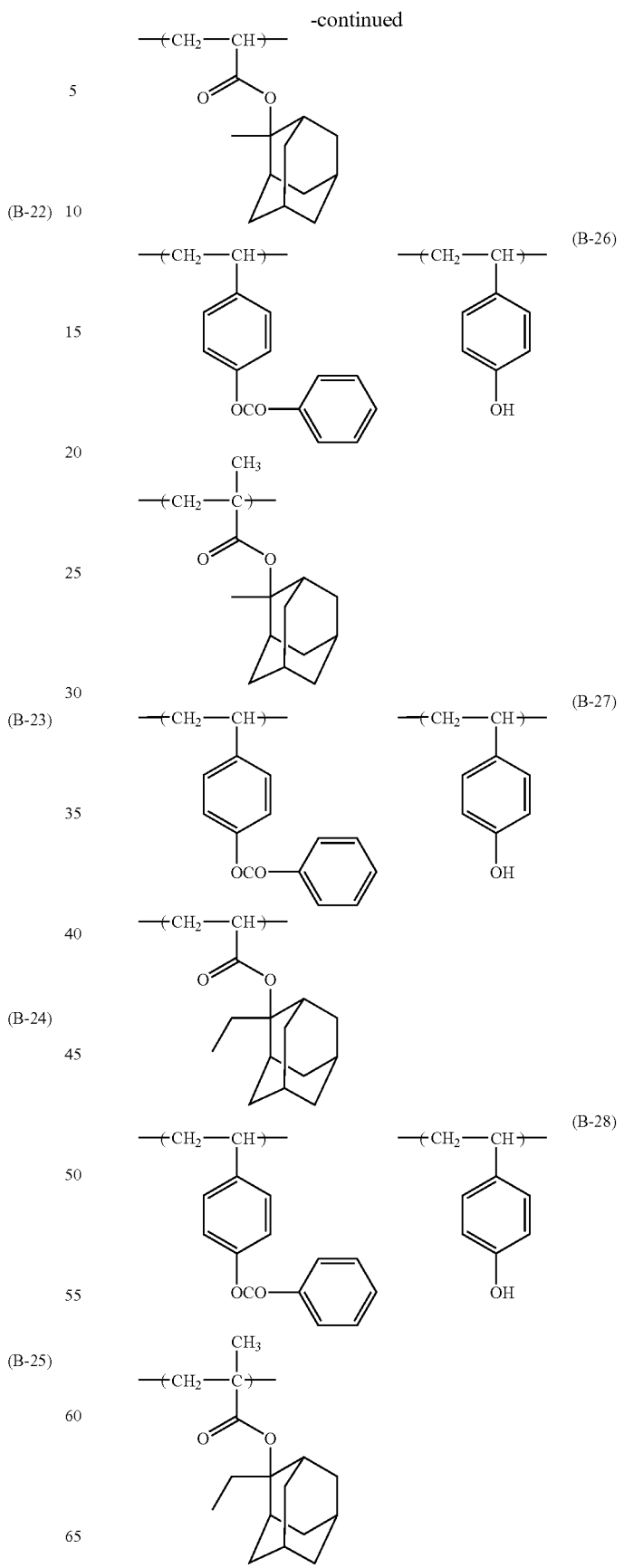

-continued
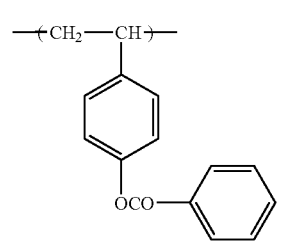 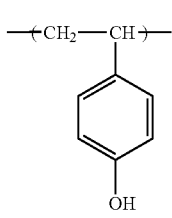 (B-29)
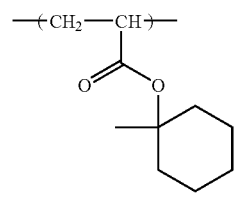
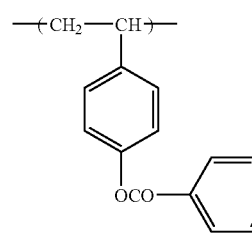 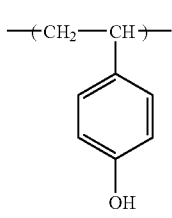 (B-30)
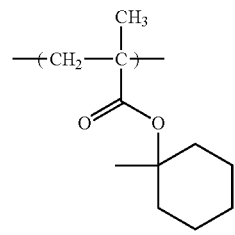  (B-31)
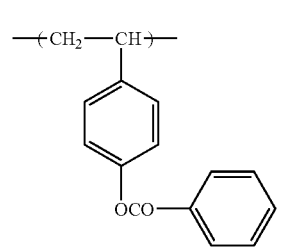 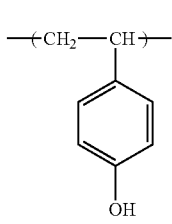
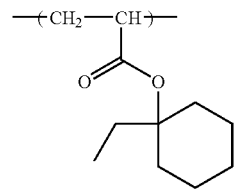  (B-32)
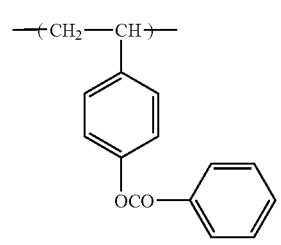 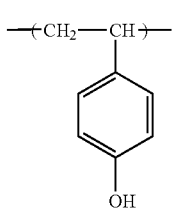
-continued
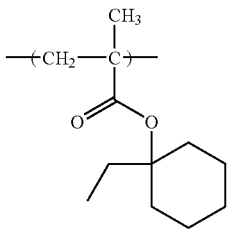
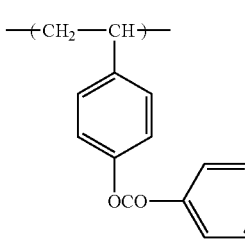 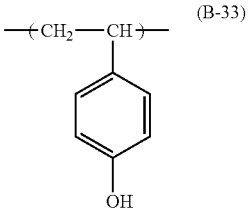 (B-33)
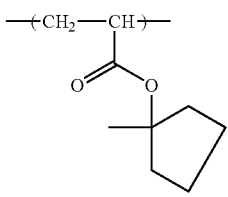
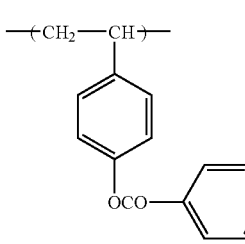 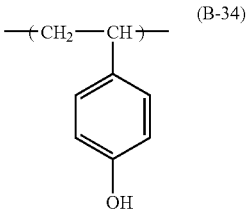 (B-34)
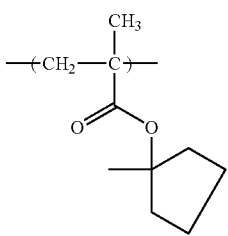
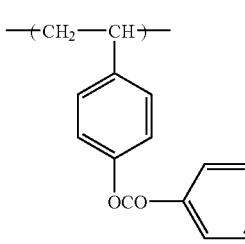 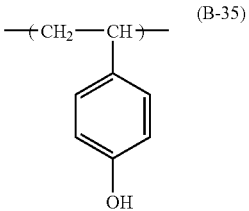 (B-35)

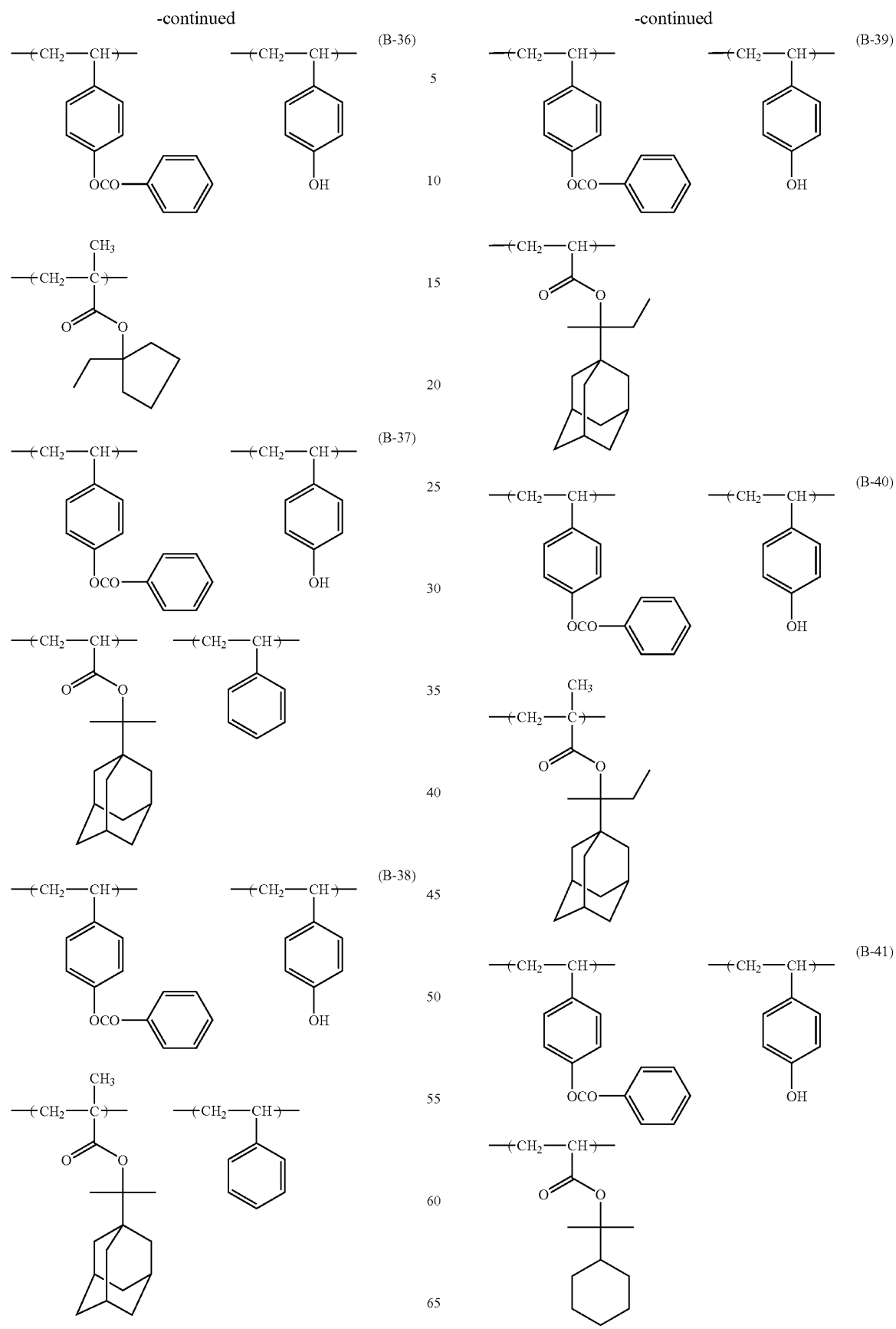

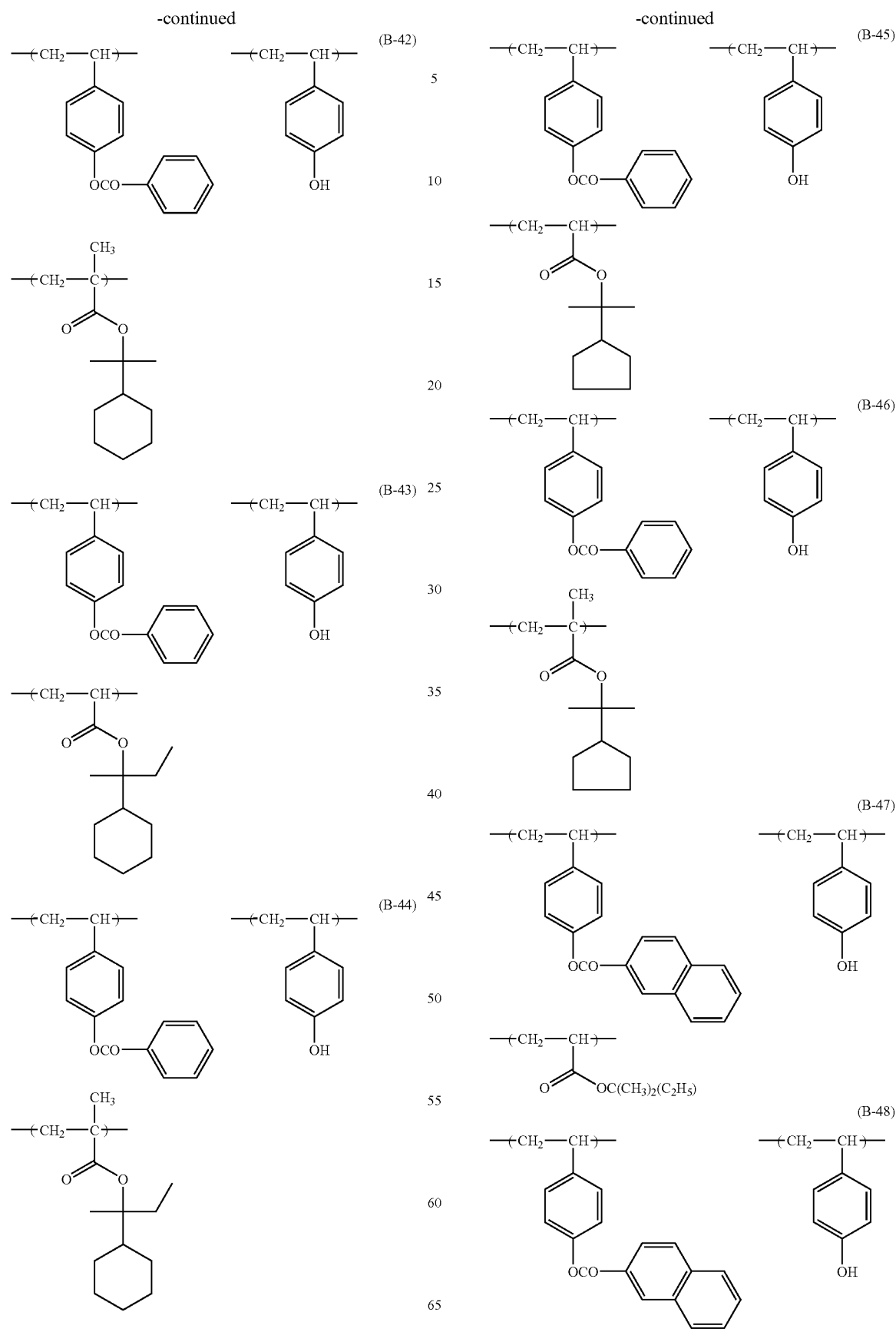

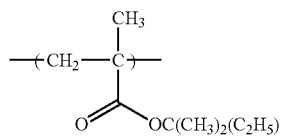
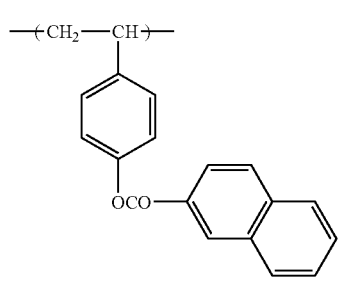
(B-49)
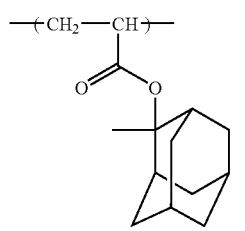
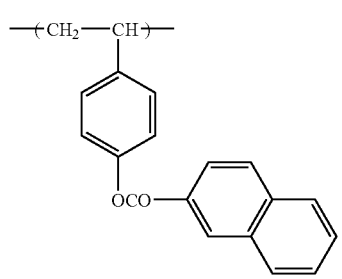
(B-50)
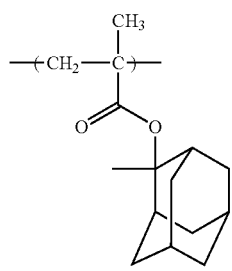
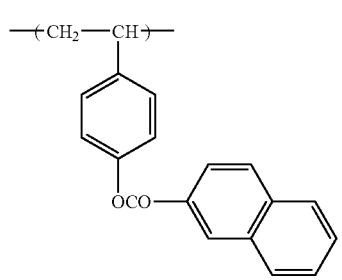
(B-51)
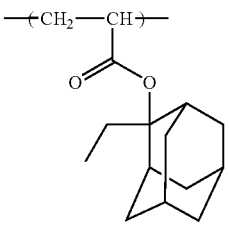
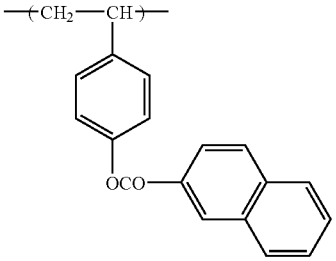
(B-52)
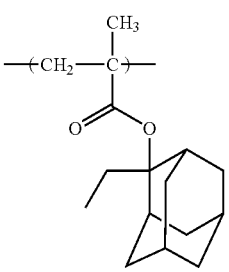
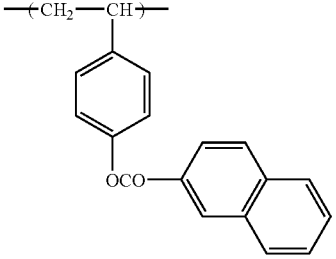 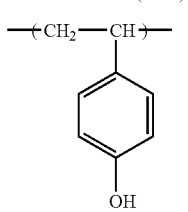
(B-53)
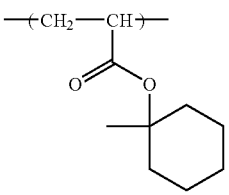
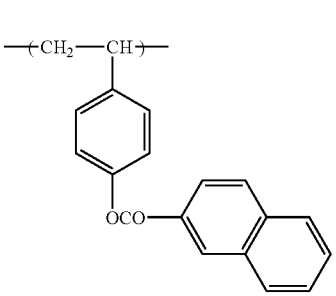
(B-54)

-continued
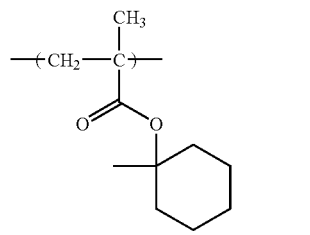
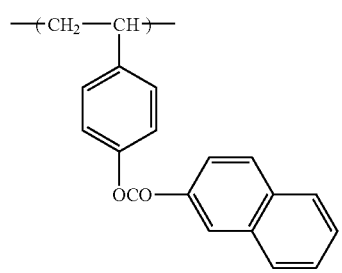
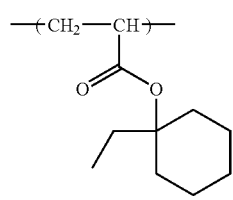 (B-55)
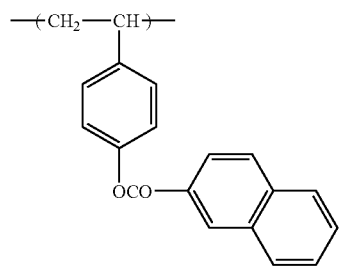
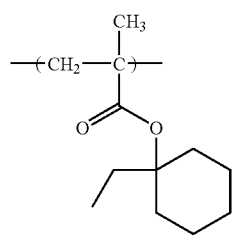 (B-56)
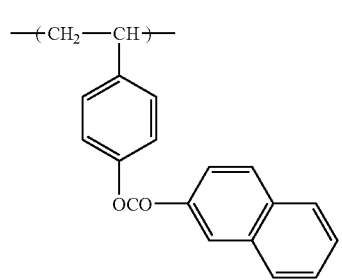
(B-57)
-continued
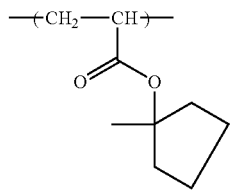
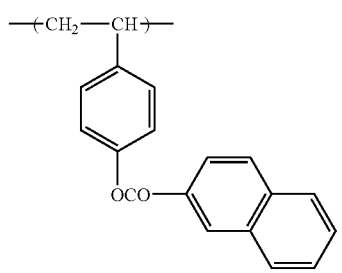
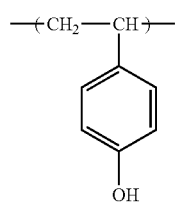 (B-58)
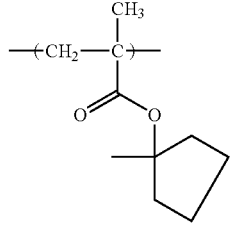
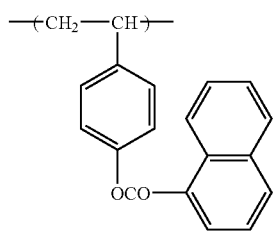
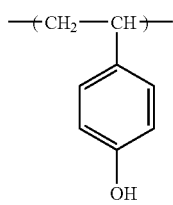 (B-59)
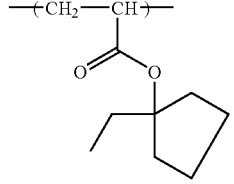
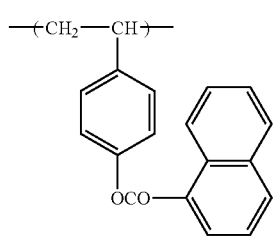
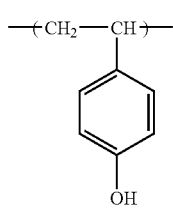 (B-60)
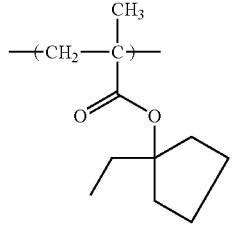

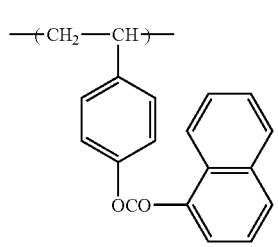
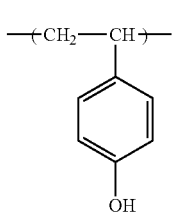
(B-61)
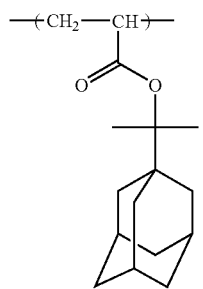
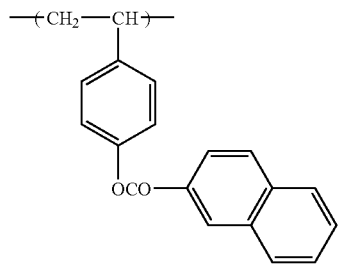
(B-62)
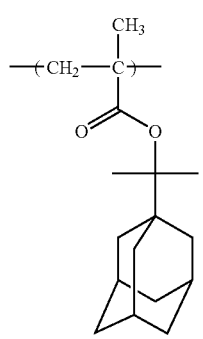
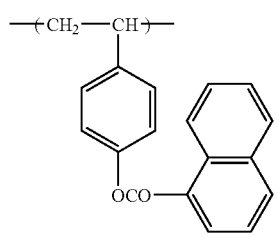
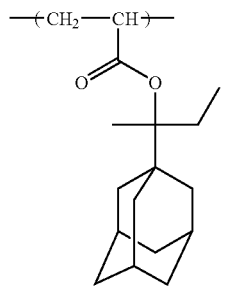
(B-63)
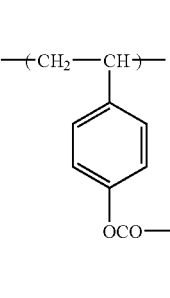
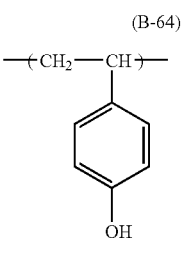
(B-64)
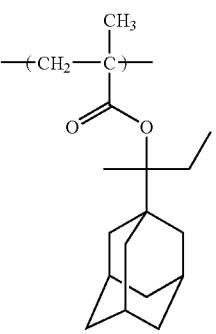
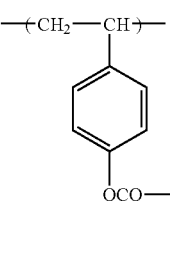
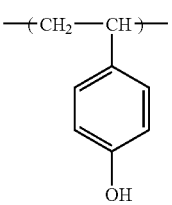
(B-65)
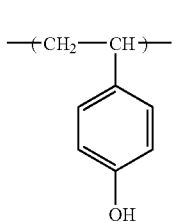
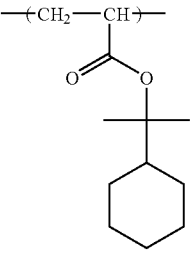
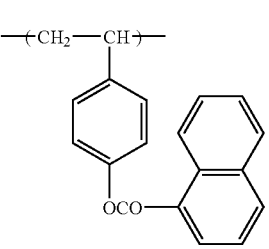
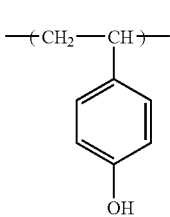
(B-66)

-continued
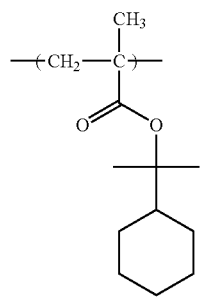
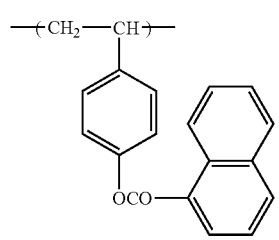
(B-67)
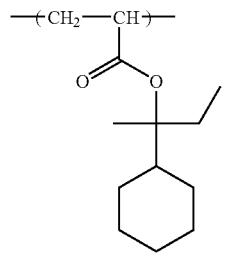
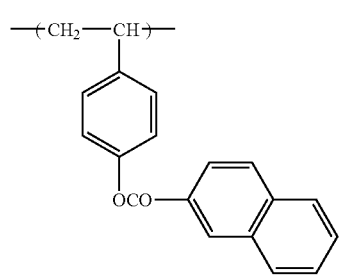
(B-68)
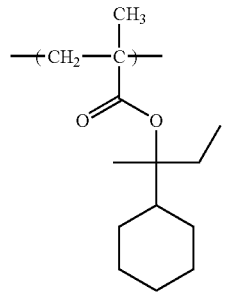
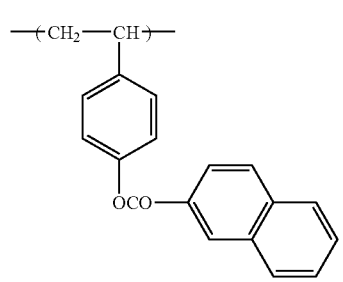
(B-69)
-continued
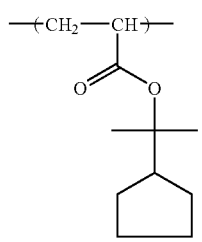
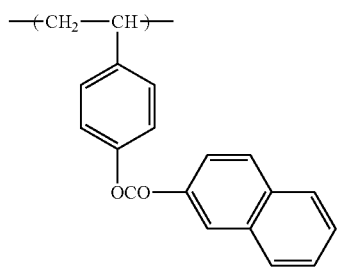
(B-70)
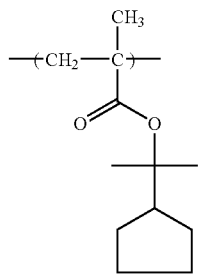
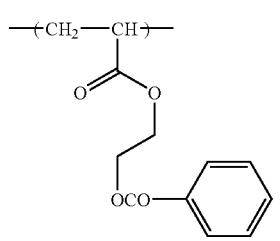
(B-71)
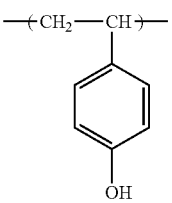
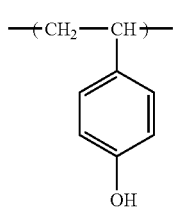
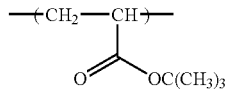
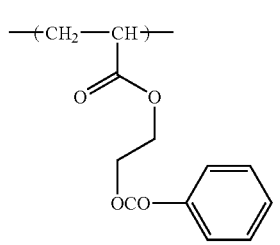
(B-72)
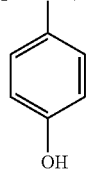
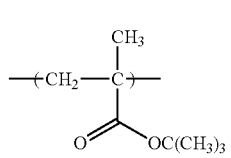

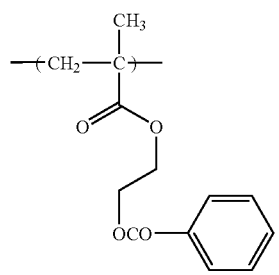
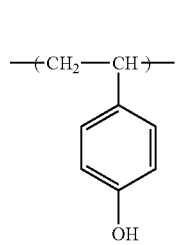
(B-73)
(B-74)
(B-75)
(B-76)
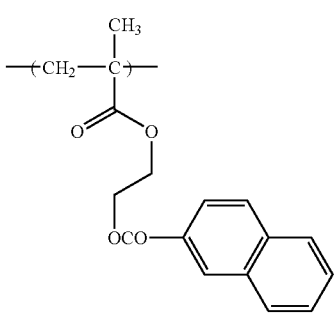
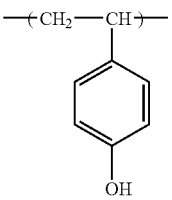
(B-77)
(B-78)
(B-79)
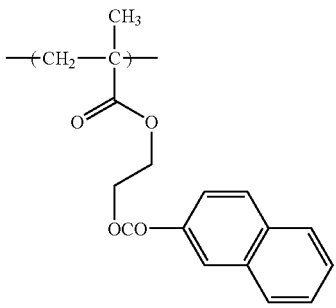
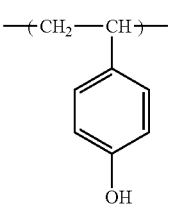
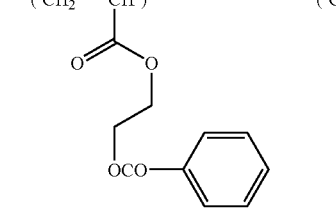
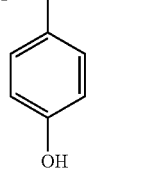
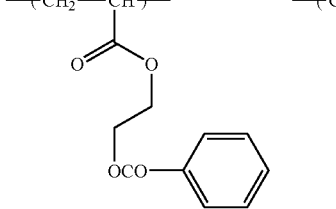
(B-80)

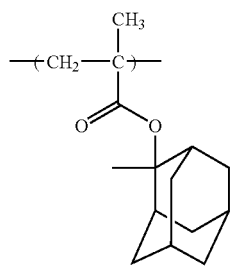
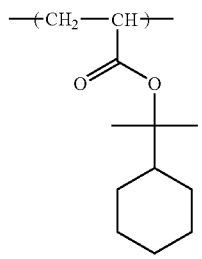
(B-81)
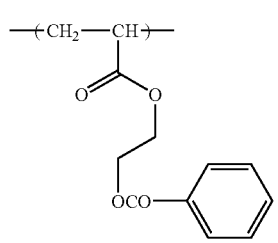
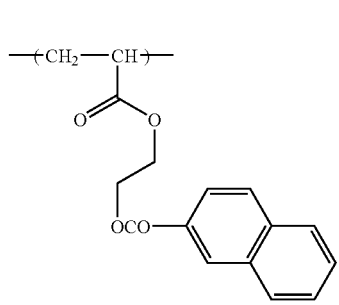
(B-84)
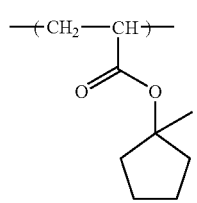
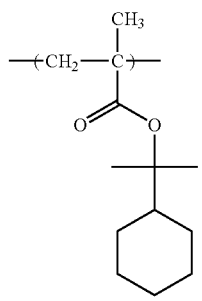
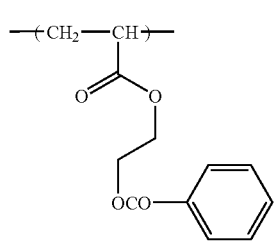
(B-82)
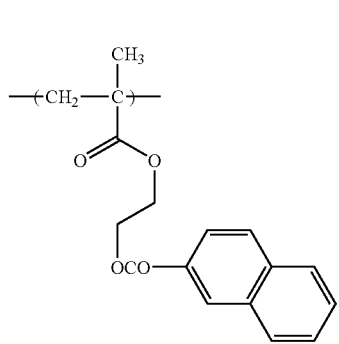
(B-85)
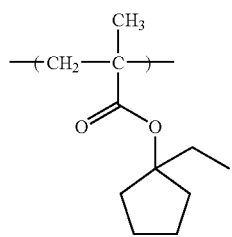
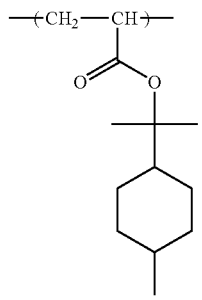
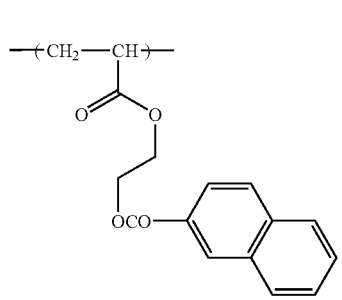
(B-83)

-continued
(B-86)
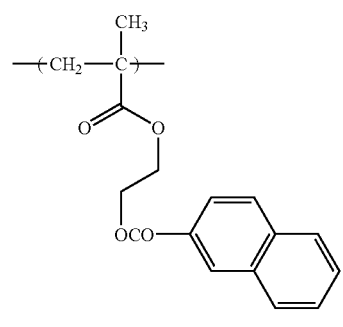 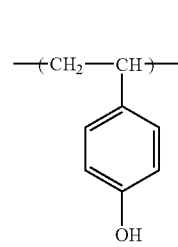
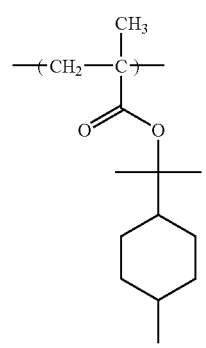
(B-87)
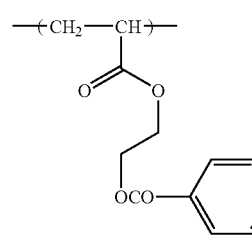 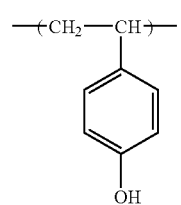
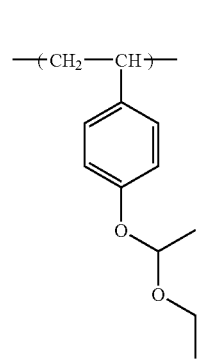
(B-88)
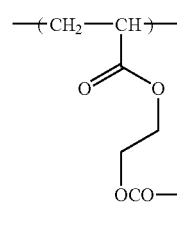 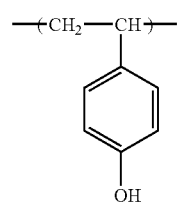
-continued
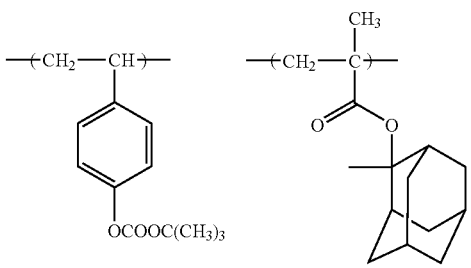
(B-89)
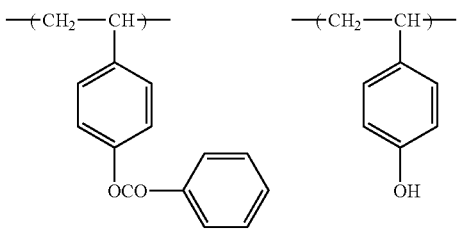
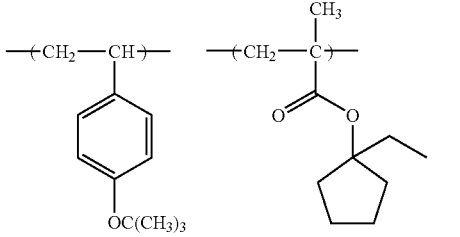
(B-90)
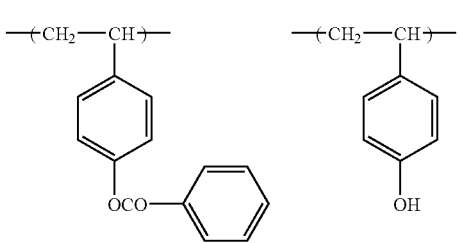
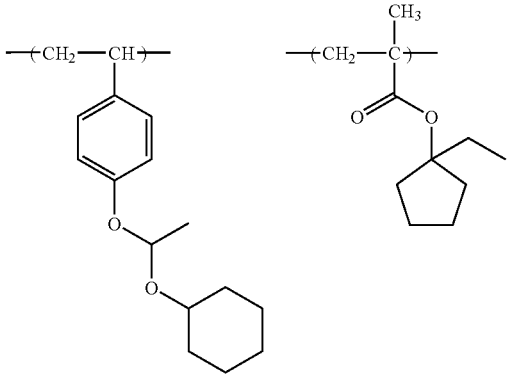
(B-91)
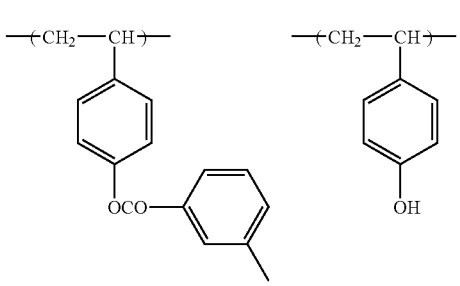

-continued

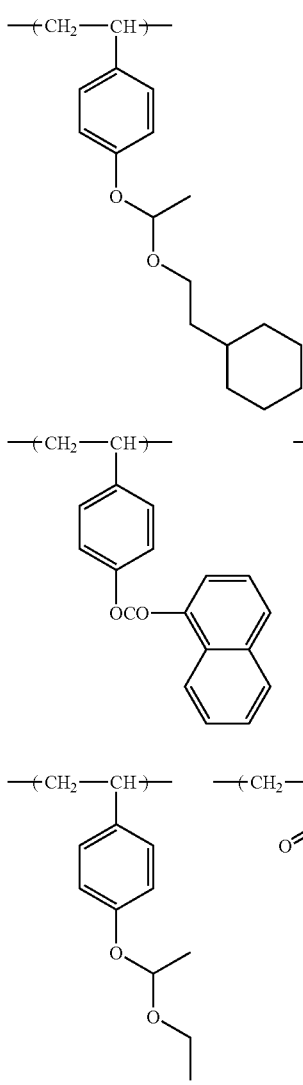

(B-92)

(A) Compound capable of generating acid upon irradiation with actinic rays or radiation The positive resist composition of the present invention contains a compound capable of generating an acid upon irradiation with actinic rays or radiation (hereinafter sometimes referred to as an "acid generator" or "component (A)").

The acid generator which can be used may be appropriately selected from a photoinitiator for photocationic polymerization, a photoinitiator for photoradical polymerization, a photo-decoloring agent for coloring matters, a photo-discoloring agent, a compound known to generate an acid upon irradiation with actinic rays or radiation and used for microresist or the like, and a mixture thereof.

Examples thereof include a diazonium salt, a phosphonium salt, a sulfonium salt, an iodonium salt, an imidosulfonate, an oxime sulfonate, a diazodisulfone, a disulfone and an o-nitrobenzyl sulfonate.

Also, a compound where such a group or compound capable of generating an acid upon irradiation with actinic rays or radiation is introduced into the main or side chain of the polymer, for example, compounds described in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029, may be used.

Furthermore, compounds capable of generating an acid by the effect of light described, for example, in U.S. Pat. No. 3,779,778 and European Patent 126,712 may also be used.

Out of the compounds capable of generating an acid upon irradiation with actinic rays or radiation, the compounds represented by the following formulae (ZI), (ZII) and (ZIII) are preferred.

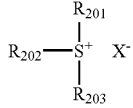

ZI

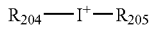

ZII

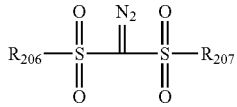

ZIII

In formula (ZI), $R_{201}$, $R_{202}$ and $R_{203}$ each independently represents an organic group.

$X^-$ represents a non-nucleophilic anion, and preferred examples thereof include sulfonate anion, carboxylate anion, bis(alkylsulfonyl)amide anion, tris(alkylsulfonyl)methide anion, $BF_4^-$, $PF_6^-$ and $SbF_6^-$. $X^-$ is preferably an organic anion having a carbon atom.

The preferred organic anion includes the organic anions represented by the following formulae (AN1) to (AN4):

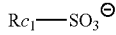

AN1

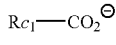

AN2

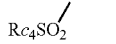

AN3

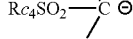
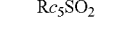

AN4

In formulae (AN1) and (AN2), $Rc_1$ represents an organic group.

The organic group in $Rc_1$ includes an organic group having a carbon number of 1 to 30 and is preferably an alkyl, cycloalkyl or aryl group which may be substituted, or a group where a plurality of these groups are connected through a single bond or a linking group such as —O—, —CO$_2$—, —S—, —SO$_3$— and —SO$_2$N(Rd$_1$)—. Rd$_1$ represents a hydrogen atom or an alkyl group and may form a ring structure with the alkyl, cycloalkyl or aryl group to which Rd$_1$ is bonded.

The organic group of $Rc_1$ is more preferably an alkyl group substituted by a fluorine atom or a fluoroalkyl group at the 1-position, a cycloalkyl group substituted by a fluorine atom or a fluoroalkyl group, or an aryl group (preferably phenyl group) substituted by a fluorine atom or a fluoroalkyl group. By virtue of having a fluorine atom or a fluoroalkyl group, the acidity of the acid generated upon irradiation with light increases and the sensitivity is enhanced. When $Rc_1$ has 5 or more carbon atoms, at least one carbon atom is preferably such that the hydrogen atoms are not entirely replaced by a fluorine atom but a part of the hydrogen atoms remain, and the number of hydrogen atoms is more preferably larger than the number of fluorine atoms. The absence of a perfluoroalkyl group having a carbon number of 5 or more enables reduction in the toxicity to ecology.

In a still more preferred embodiment, $Rc_1$ is a group represented by the following formula.

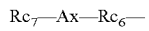

$$Rc_7-Ax-Rc_6-$$

In the formula, $Rc_6$ represents a perfluoroalkylene group having a carbon number of 4 or less, preferably from 2 to 4, more preferably 2 or 3, or a phenylene group substituted by from 1 to 4 fluorine atoms and/or from 1 to 3 fluoroalkyl groups.

Ax represents a single bond or a divalent linking group (preferably —O—, —$CO_2$—, —S—, —$SO_3$— or —$SO_2N(Rd_1)$—). $Rd_1$ represents a hydrogen atom or an alkyl group and may combine with $Rc_7$ to form a ring structure.

$Rc_7$ represents a hydrogen atom, a fluorine atom, a linear or branched alkyl group which may be substituted, a monocyclic or polycyclic cycloalkyl group which may be substituted, or an aryl group which may be substituted. The alkyl group, cycloalkyl group and aryl group, which each may be substituted, preferably contain no fluorine atom as the substituent.

In formulae (AN3) and (AN4), $Rc_3$, $Rc_4$ and $Rc_5$ each independently represents an organic group.

Preferred organic groups for $Rc_3$, $Rc_4$ and $Rc_5$ are the same as preferred organic groups in $Rc_1$.

$Rc_3$ and $Rc_4$ may combine to form a ring.

The group formed by combining $Rc_3$ and $Rc_4$ includes an alkylene group, a cycloalkylene group and an arylene group and is preferably a perfluoroalkylene group having a carbon number of 2 to 4. When $Rc_3$ and $Rc_4$ combine to form a ring, this is preferred because the acidity of the acid generated upon irradiation with light increases and the sensitivity is enhanced.

In formula (ZI), the number of carbons in the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain an oxygen atom, a sulfur atom, an ester bond, an amide bond or a carbonyl group.

Examples of the group formed by combining two members out of $R_{201}$ to $R_{203}$ include an alkylene group (e.g., butylene, pentylene).

Specific examples of the organic group as $R_{201}$, $R_{202}$ and $R_{203}$ include the corresponding groups in the compounds (ZI-1), (ZI-2) and (ZI-3) which are described later.

The compound may be a compound having a plurality of structures represented by formula (ZI), for example, may be a compound having a structure where at least one of $R_{201}$ to $R_{203}$ in the compound represented by formula (ZI) is bonded to at least one of $R_{201}$ to $R_{203}$ in another compound represented by formula (ZI).

The component (ZI) is more preferably a compound (ZI-1), (ZI-2) or (ZI-3) described below.

The compound (ZI-1) is an arylsulfonium compound where at least one of $R_{201}$ to $R_{203}$ in formula (ZI) is an aryl group, that is, a compound having an arylsulfonium as the cation.

In the arylsulfonium compound, $R_{201}$ to $R_{203}$ all may be an aryl group or a part of $R_{201}$ to $R_{203}$ may be an aryl group with the remaining being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound and an aryldicycloalkylsulfonium compound.

The aryl group in the arylsulfonium compound is preferably an aryl group such as phenyl group and naphthyl group, or a heteroaryl group such as indole residue and pyrrole residue, more preferably a phenyl group or an indole residue. In the case where the arylsulfonium compound has two or more aryl groups, these two or more aryl groups may be the same of different.

The alkyl group which is present, if desired, in the arylsulfonium compound is preferably a linear or branched alkyl group having a carbon number of 1 to 15, and examples thereof include a methyl group, an ethyl group, a propyl group, an n-butyl group, a sec-butyl group and a tert-butyl group.

The cycloalkyl group which is present, if desired, in the arylsulfonium compound is preferably a cycloalkyl group having a carbon number of 3 to 15, and examples thereof include a cyclopropyl group, a cyclobutyl group and a cyclohexyl group.

The aryl group, alkyl group and cycloalkyl group of $R_{201}$ to $R_{203}$ each may have, as the substituent, an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 14), an alkoxy group (for example, an alkoxy group having a carbon number of 1 to 15), a halogen atom, a hydroxyl group or a phenylthio group. The substituent is preferably a linear or branched alkyl group having a carbon number of 1 to 12, a cycloalkyl group having a carbon number of 3 to 12, or a linear, branched or cyclic alkoxy group having a carbon number of 1 to 12, more preferably an alkyl group having a carbon number of 1 to 4 or an alkoxy group having a carbon number of 1 to 4. The substituent may be substituted to any one of three members $R_{201}$ to $R_{203}$ or may be substituted to all of these three members. In the case where $R_{201}$ to $R_{203}$ are an aryl group, the substituent is preferably substituted at the p-position of the aryl group.

The compound (ZI-2) is described below.

The compound (ZI-2) is a compound where $R_{201}$ to $R_{203}$ in formula (ZI) each independently represents an aromatic ring-free organic group. The aromatic ring as used herein includes an aromatic ring containing a heteroatom.

The aromatic ring-free organic group as $R_{201}$ to $R_{203}$ generally has a carbon number of 1 to 30, preferably from 1 to 20.

$R_{201}$ to $R_{203}$ each is independently preferably an alkyl group, a cycloalkyl group, an allyl group or a vinyl group, more preferably a linear, branched or cyclic 2-oxoalkyl group or an alkoxycarbonylmethyl group, still more preferably a linear or branched 2-oxoalkyl group.

The alkyl group as $R_{201}$ to $R_{203}$ may be either linear or branched and is preferably a linear or branched alkyl group having a carbon number of 1 to 10 (e.g., methyl, ethyl, propyl, butyl, pentyl). The alkyl group as $R_{201}$ to $R_{203}$ is more preferably a linear or branched 2-oxoalkyl group or an alkoxymethyl group.

The cycloalkyl group as $R_{201}$ to $R_{203}$ is preferably a cycloalkyl group having a carbon number of 3 to 10 (e.g., cyclopentyl, cyclohexyl, norbornyl). The cycloalkyl group as $R_{201}$ to $R_{203}$ is more preferably a cyclic 2-oxoalkyl group.

The 2-oxoalkyl group as $R_{201}$ to $R_{203}$ may be linear, branched or cyclic and is preferably a group having >C=O at the 2-position of the above-described alkyl group or cycloalkyl group.

The alkoxy group in the alkoxycarbonylmethyl group as $R_{201}$ to $R_{203}$ is preferably an alkoxy group having a carbon number of 1 to 5 (e.g., methoxy, ethoxy, propoxy, butoxy, pentoxy).

$R_{201}$ to $R_{203}$ each may be further substituted by a halogen atom, an alkoxy group (for example, an alkoxy group having a carbon number of 1 to 5), a hydroxyl group, a cyano group or a nitro group.

The compound (ZI-3) is a compound represented by the following formula (ZI-3), and this is a compound having a phenacylsulfonium salt structure.

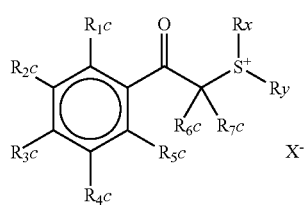

(ZI-3)

In formula (ZI-3), $R_{1c}$ to $R_{5c}$ each independently represents a hydrogen atom, an alkyl group, a cycloalkyl group, an alkoxy group or a halogen atom.

$R_{6c}$ and $R_{7c}$ each independently represents a hydrogen atom, an alkyl group or a cycloalkyl group.

$R_x$ and $R_y$ each independently represents an alkyl group, a cycloalkyl group, an allyl group or a vinyl group.

Any two or more members out of $R_{1c}$ to $R_{7c}$ or a pair of $R_x$ and $R_y$ may combine with each other to form a ring structure, and the ring structure may contain an oxygen atom, a sulfur atom, an ester bond or an amide bond. Examples of the group formed by combining any two or more members out of $R_1$ to $R_{7c}$ or a pair of $R_x$ and $R_y$ include a butylene group and a pentylene group.

$X^-$ represents a non-nucleophilic anion, and examples thereof are the same as those of $X^-$ in formula (ZI).

The alkyl group as $R_{1c}$ to $R_{7c}$ may be linear or branched and is, for example, an alkyl group having a carbon number of 1 to 20, preferably a linear or branched alkyl group having a carbon number of 1 to 12 (e.g., methyl, ethyl, linear or branched propyl, linear or branched butyl, linear or branched pentyl).

The cycloalkyl group as $R_{1c}$ to $R_{7c}$ is preferably a cycloalkyl group having a carbon number of 3 to 8 (e.g., cyclopentyl, cyclohexyl).

The alkoxy group as $R_{1c}$ to $R_{5c}$ may be linear, branched or cyclic and is, for example, an alkoxy group having a carbon number of 1 to 10, preferably a linear or branched alkoxy group having a carbon number of 1 to 5 (e.g., methoxy, ethoxy, linear or branched propoxy, linear or branched butoxy, or linear or branched pentoxy), or a cyclic alkoxy group having a carbon number of 3 to 8 (e.g., cyclopentyloxy, cyclohexyloxy).

A compound where any one of $R_{1c}$ to $R_{5c}$ is a linear or branched alkyl group, a cycloalkyl group or a linear, branched or cyclic alkoxy group is preferred, and a compound where the sum of carbon numbers of $R_{1c}$ to $R_{5c}$ is from 2 to 15 is more preferred. By virtue of this construction, the solubility in a solvent is more enhanced and generation of particles during storage is suppressed.

Examples of the alkyl group as $R_x$ and $R_y$ are the same as those of the alkyl group as $R_{1c}$ to $R_{7c}$. The alkyl group as $R_x$ and $R_y$ is preferably a linear or branched 2-oxoalkyl group or an alkoxycarbonylmethyl group.

Examples of the cycloalkyl group as $R_x$ and $R_y$ are the same as those of the cycloalkyl group as $R_{1c}$ to $R_{7c}$. The cycloalkyl group as $R_x$ and $R_y$ is preferably a cyclic 2-oxoalkyl group.

Examples of the linear, branched or cyclic 2-oxoalkyl group include a group having >C=O at the 2-position of the alkyl group or cycloalkyl group as $R_{1c}$ to $R_{7c}$.

Examples of the alkoxy group in the alkoxycarbonylmethyl group are the same as those of the alkoxy group as $R_{1c}$ to $R_{5c}$.

$R_x$ and $R_y$ each is preferably an alkyl group having a carbon number of 4 or more, more preferably 6 or more, still more preferably 8 or more.

In formulae (ZII) and (ZIII), $R_{204}$ to $R_{207}$ each independently represents an aryl group which may have a substituent, an alkyl group which may have a substituent, or a cycloalkyl group which may have a substituent.

The aryl group of $R_{204}$ to $R_{207}$ is preferably a phenyl group or a naphthyl group, more preferably a phenyl group.

The alkyl group of $R_{204}$ to $R_{207}$ may be linear or branched and is preferably a linear or branched alkyl group having a carbon number of 1 to 10 (e.g., methyl, ethyl, propyl, butyl, pentyl).

The cycloalkyl group of $R_{204}$ to $R_{207}$ is preferably a cycloalkyl group having a carbon number of 3 to 10 (e.g., cyclopentyl, cyclohexyl, norbornyl).

Examples of the substituent which $R_{204}$ to $R_{207}$ each may have include an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 15), an alkoxy group (for example, an alkoxy group having a carbon number of 1 to 15), a halogen atom, a hydroxyl group and a phenylthio group.

$X^-$ represents a non-nucleophilic anion, and examples thereof are the same as those of the non-nucleophilic anion of $X^-$ in formula (ZI).

Out of the compounds capable of generating an acid upon irradiation with actinic rays or radiation, the compounds represented by the following formulae (ZIV), (ZV) and (ZVI) also preferred.

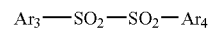

ZIV

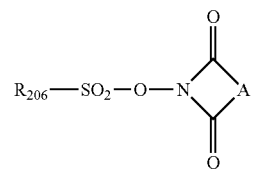

ZV

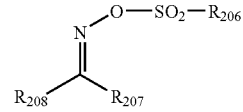

ZVI

In formulae (ZIV) to (ZVI), $Ar_3$ and $Ar_4$ each independently represents a substituted or unsubstituted aryl group.

$R_{206}$ represents a substituted or unsubstituted alkyl group, a substituted or unsubstituted cycloalkyl group, or a substituted or unsubstituted aryl group.

$R_{207}$ and $R_{208}$ each independently represents a substituted or unsubstituted alkyl group, a substituted or unsubstituted cycloalkyl group, a substituted or unsubstituted aryl group, or an electron-withdrawing group.

$R_{207}$ is preferably a substituted or unsubstituted aryl group.

$R_{208}$ is preferably an electron-withdrawing group, more preferably a cyano group or a fluoroalkyl group.

A represents a substituted or unsubstituted alkylene group, a substituted or unsubstituted cycloalkylene group, a substituted or unsubstituted alkenylene group, or a substituted or unsubstituted arylene group.

Among the compounds capable of generating an acid upon irradiation with actinic rays or radiation, the compounds represented by formulae (ZI) to (ZIII) are preferred, the compound represented by formula (ZI) is more preferred, and the compounds represented by formulae (ZI-1) to (ZI-3) are still more preferred.

Furthermore, a compound capable of generating an acid represented by any one of the following formulae (AC1) to (AC3) upon irradiation with actinic rays or radiation is preferred.

AC1

AC2

AC3

That is, a particularly preferred embodiment of the component (A) is a compound where in the structure of formula (ZI), $X^-$ is an anion selected from formulae (AN1), (AN3) and (AN4).

As for the component (A), it is one preferred embodiment to use a diazodisulfone or an oxime ester.

Furthermore, as for the component (A), it is also one preferred embodiment to use a sulfonium salt having bis(alkylsulfonyl)amide anion or tris(alkylsulfonyl)methide anion.

Out of the compounds capable of generating an acid upon irradiation with actinic rays or radiation, particularly preferred examples are set forth below.

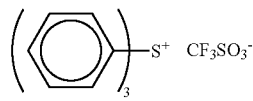
(z1)

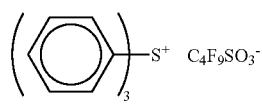
(z2)

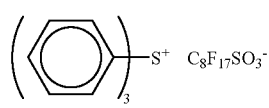
(z3)

-continued

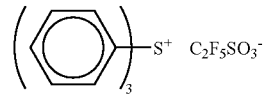
(z4)

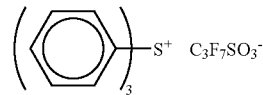
(z5)

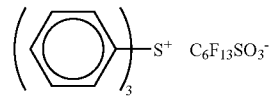
(z6)

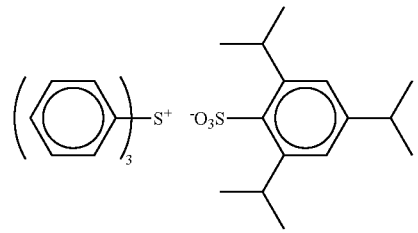
(z7)

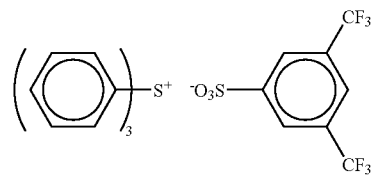
(z8)

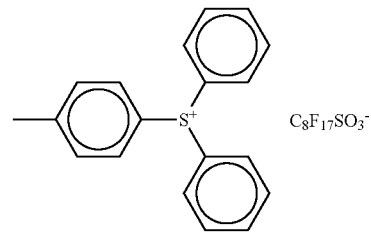
(z9)

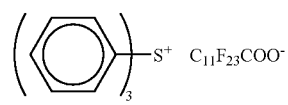
(z10)

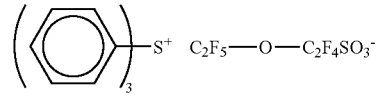
(z11)

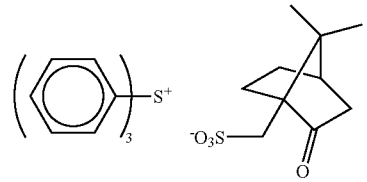
(z12)

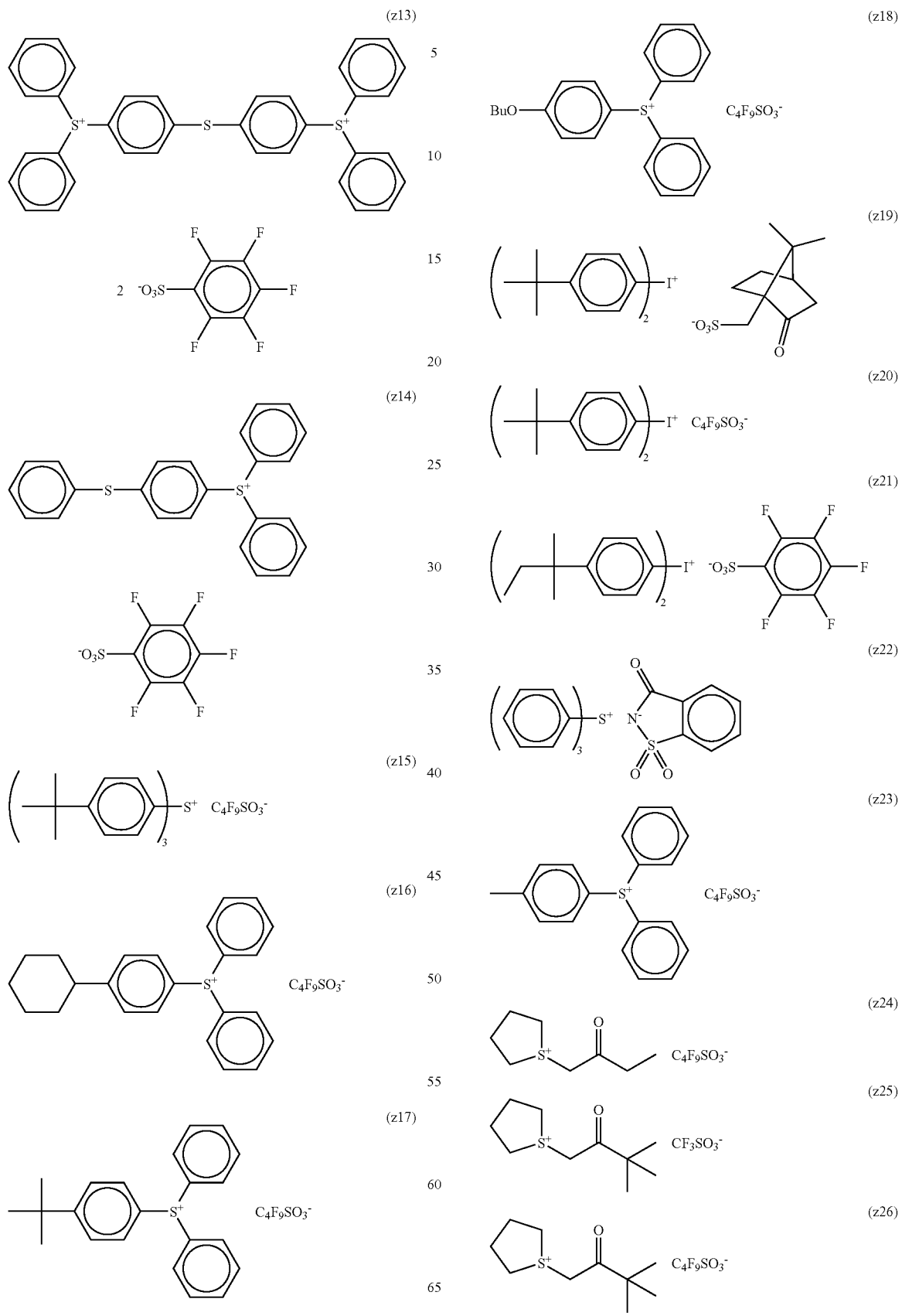

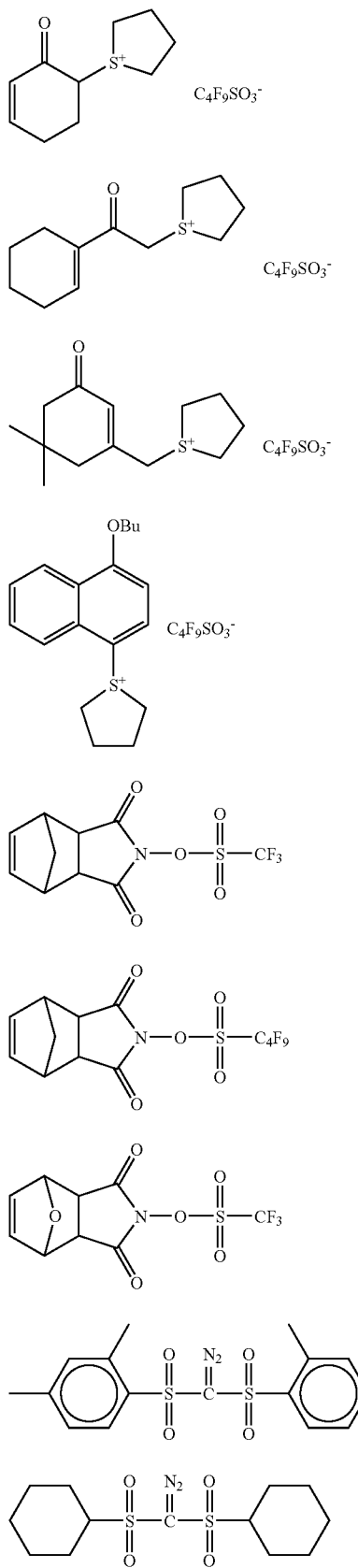
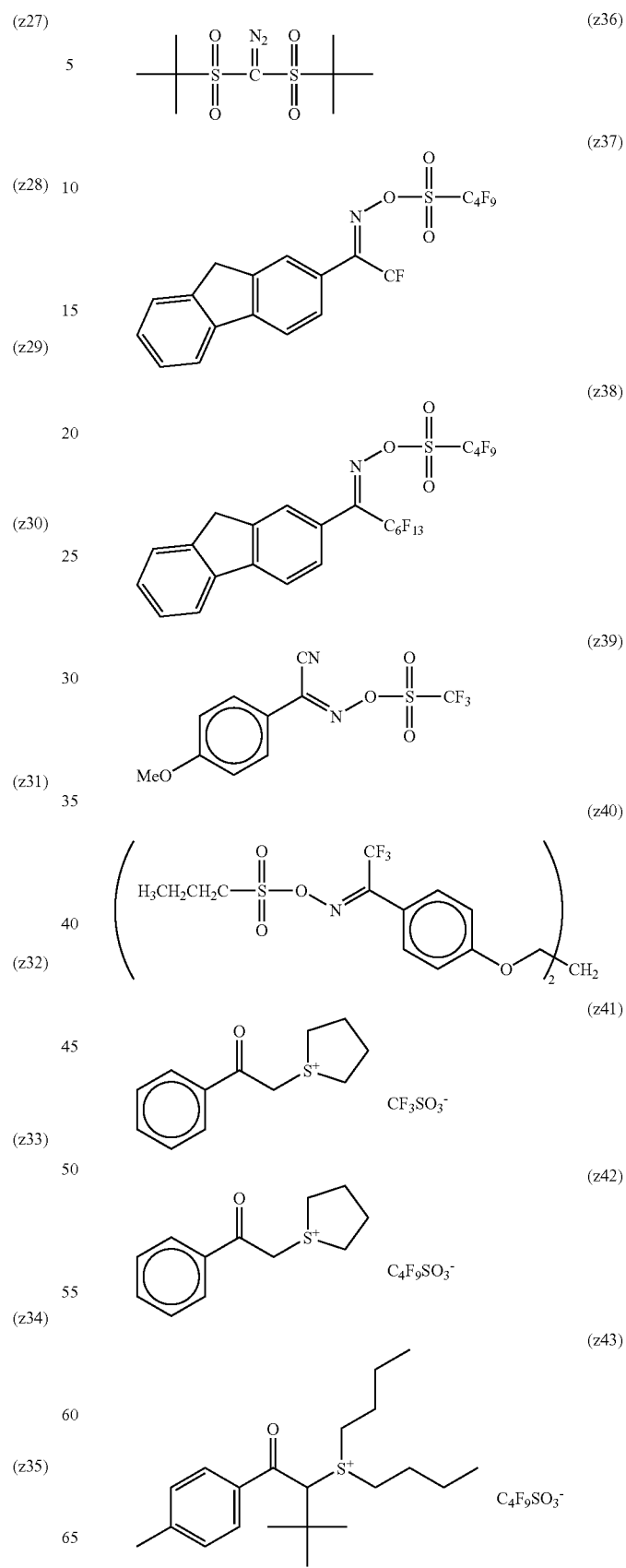

-continued
(z44)
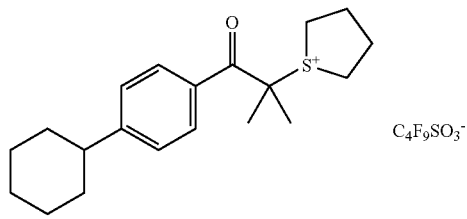
(z45)
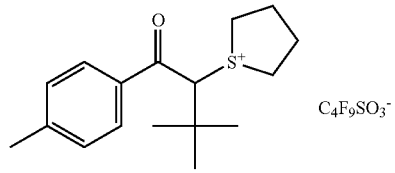
(z46)
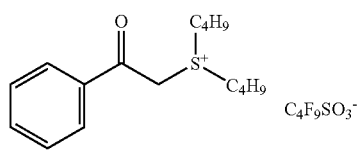
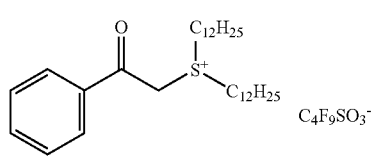
(z47)
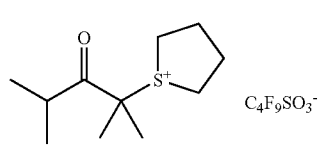
(z48)
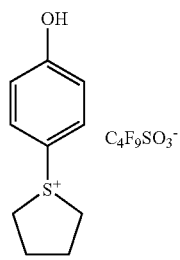
(z49)
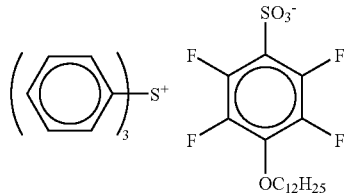
(z50)
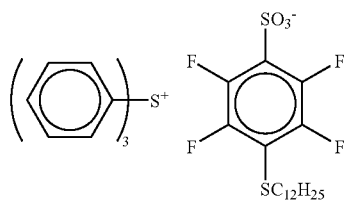
(z51)
-continued
(z52)
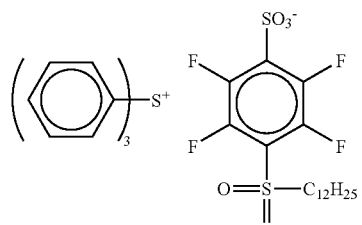
(z53)
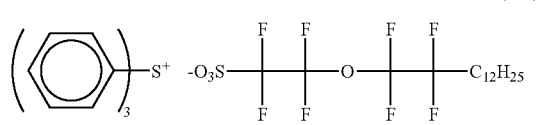
(z54)
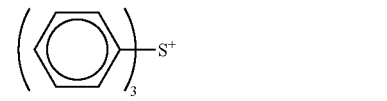
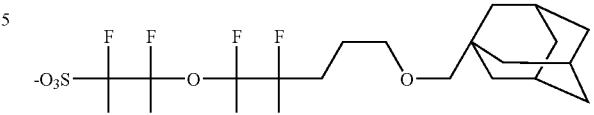
(z55)
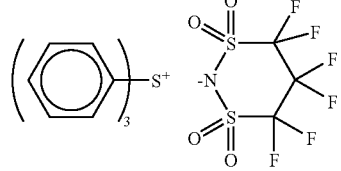
(z56)
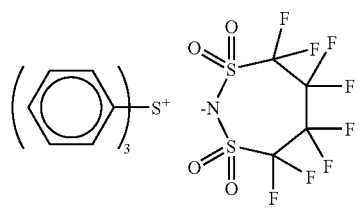
(z57)
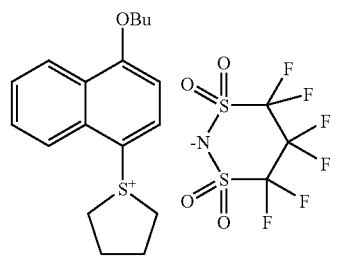
(z58)
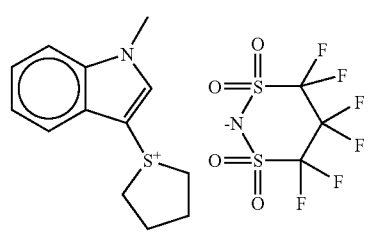

-continued

-continued
(z71)
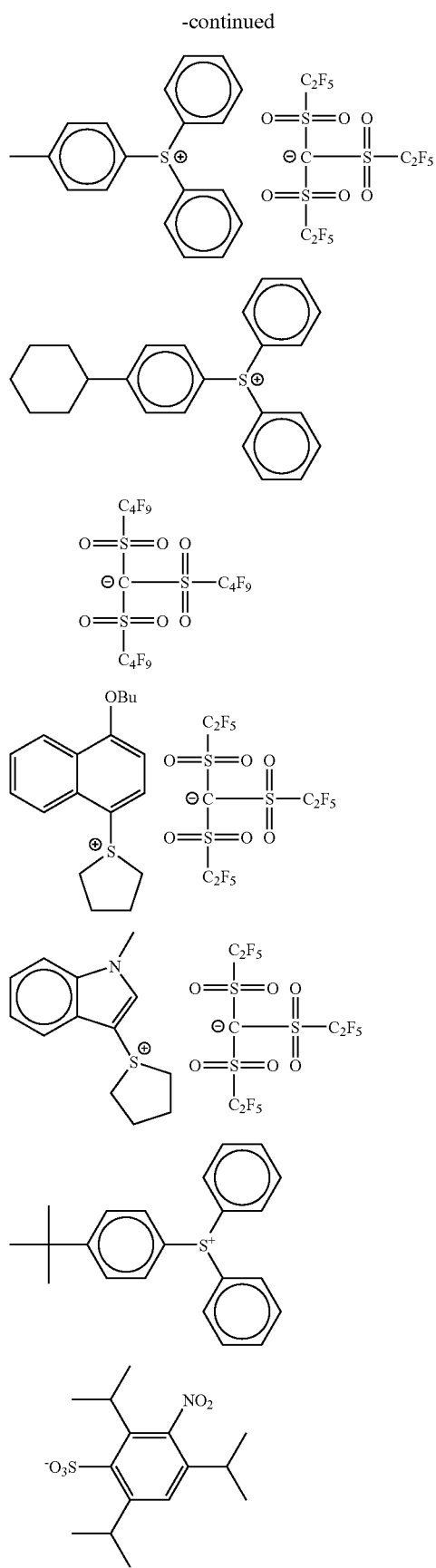
(z72)
(z73)
(z74)
(z75)
-continued
(z76)
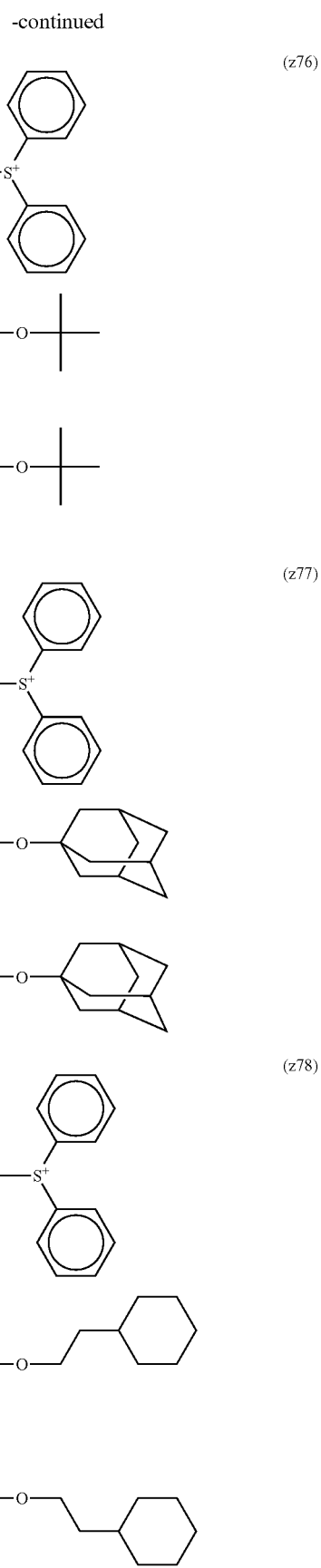
(z77)
(z78)

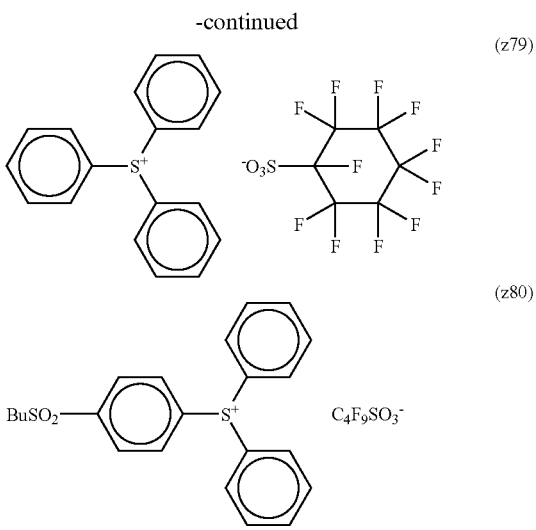

As for the photoacid generator, one species may be used alone, or two or more species may be used in combination. In the case of using two or more species in combination, compounds capable of generating two kinds of organic acids differing in the total number of atoms except for hydrogen atom by 2 or more are preferably combined.

The content of the acid generator in the composition is preferably from 0.1 to 20 mass %, more preferably from 0.5 to 10 mass %, still more preferably from 1 to 7 mass %, based on the entire solid content of the positive resist composition.

Organic Basic Compound:

In the present invention, an organic basic compound is preferably used from the standpoint of, for example, enhancing the performance (e.g., resolving power) or storage stability. The organic basic compound is more preferably a nitrogen atom-containing compound (nitrogen-containing basic compound).

The organic basic compound preferred in the present invention is a compound having basicity stronger than that of phenol.

The preferred chemical environment thereof includes structures of the following formulae (A) to (E). The structures of formulae (B) to (E) each may form a part of a ring structure.

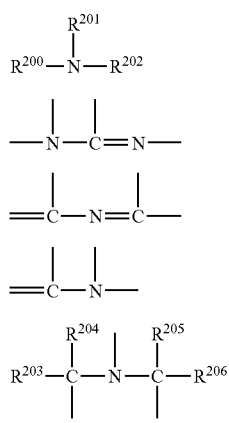

In formula (A), $R^{200}$, $R^{201}$ and $R^{202}$, which may be the same or different, each represents a hydrogen atom, an alkyl group having a carbon number of 1 to 20, a cycloalkyl group having a carbon number of 3 to 20, or an aryl group having a carbon number of 6 to 20. $R^{201}$ and $R^{202}$ may combine with each other to form a ring.

The alkyl group, cycloalkyl group and aryl group as $R^{200}$, $R^{201}$ and $R^{202}$ each may have a substituent. The alkyl group or cycloalkyl group having a substituent is preferably an aminoalkyl group having a carbon number of 1 to 20, an aminocycloalkyl group having a carbon number of 3 to 20, a hydroxyalkyl group having a carbon number of 1 to 20, or a hydroxycycloalkyl group having a carbon number of 3 to 20.

In formula (E), $R^{203}$, $R^{204}$, $R^{205}$ and $R^{206}$, which may be the same or different, each represents an alkyl group or cycloalkyl group having a carbon number of 1 to 6.

The compound is more preferably a nitrogen-containing basic compound having two or more nitrogen atoms differing in the chemical environment within one molecule, still more preferably a compound containing both a substituted or unsubstituted amino group and a nitrogen-containing ring structure, or a compound having an alkylamino group.

Specific preferred examples thereof include guanidine, aminopyridine, aminoalkylpyridine, aminopyrrolidine, indazole, imidazole, pyrazole, pyrazine, pyrimidine, purine, imidazoline, pyrazoline, piperazine, aminomorpholine and aminoalkylmorpholine. Preferred examples of the substituent which these compounds each may have include an amino group, an alkylamino group, an aminoaryl group, an arylamino group, an alkyl group (as the substituted alkyl group, particularly an aminoalkyl group), an alkoxy group, an acyl group, an acyloxy group, an aryl group, an aryloxy group, a nitro group, a hydroxyl group and a cyano group.

More preferred examples of the compound include, but are not limited to, guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine and N-(2-aminoethyl)morpholine.

One of these nitrogen-containing basic compounds may be used alone, or two or more kinds thereof may be used in combination.

Preferred examples of the compound include a compound having an imidazole structure, a diazabicyclo structure, a trialkylamine structure or an aniline structure, an alkylamine derivative having a hydroxyl group and/or an ether bond, and an aniline derivative having a hydroxyl group and/or an ether bond.

Examples of the compound having an imidazole structure include imidazole, 2,4,5-triphenylimidazole, benzimidazole and 2-phenylbenzimidazole. Examples of the compound having a diazabicyclo structure include 1,4-diazabicyclo[2,2,2]octane, 1,5-diazabicyclo[4,3,0]non-5-ene and 1,8-diazabicyclo[5,4,0]undec-7-ene. Examples of the compound having a trialkylamine structure include tri(n-butyl)amine, tri(n-octyl) amine and dicyclohexylmethylamine. Examples of the aniline compound include 2,6-diisopropylaniline, N,N-dimethylaniline, N,N-dibutylaniline and N,N-dihexylaniline. Examples of the alkylamine derivative having a hydroxyl group and/or an ether bond include ethanolamine, diethanolamine, triethanolamine, N-phenyldiethanolamine and tris(methoxyethoxyethyl)amine. Examples of the aniline derivative having a hydroxyl group and/or an ether bond include N,N-bis(hydroxyethyl)aniline.

One of these nitrogen-containing basic compounds is used alone, or two or more species thereof are used in combination.

A tetraalkylammonium salt-type nitrogen-containing basic compound may also be used. Among such compounds, a tetraalkylammonium hydroxide having a carbon number of 1 to 8 (e.g., tetramethylammonium hydroxide, tetraethylammonium hydroxide, tetra-(n-butyl)ammonium hydroxide) is preferred.

One of these nitrogen-containing basic compounds may be used alone, or two or more kinds thereof may be used in combination.

As for the ratio between the acid generator and the organic basic compound used in the composition, the (total amount of acid generator)/(organic basic compound) (ratio by mol) is preferably from 2.5 to 300. When this molar ratio is 2.5 or more, high sensitivity is obtained, and when the molar ratio is 300 or less, the resist pattern can be prevented from thickening in aging after exposure until heat treatment and the resolving power can be enhanced. The (total amount of acid generator)/(organic basic compound) (ratio by mol) is more preferably from 5.0 to 200, still more preferably from 7.0 to 150.

Surfactants:

In the present invention, surfactants may be used and this is preferred in view of film-forming property, adhesion of pattern, reduction of development defects, and the like.

Specific examples of the surfactant include a nonionic surfactant such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkylallyl ethers (e.g., polyoxyethylene octylphenol ether, polyoxyethylene nonylphenol ether), polyoxyethylene.polyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate) and polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate); a fluorine-containing surfactant and a silicon-containing surfactant, such as EFtop EF301, EF303 and EF352 (produced by Shin-Akita Chemical Co., Ltd.), Megafac F171 and F173 (produced by Dainippon Ink & Chemicals, Inc.), Florad FC430 and FC431 (produced by Sumitomo 3M Inc.), Asahiguard AG710, Surflon S-382, SC101, SC102, SC103, SC104, SC105 and SC106 (produced by Asahi Glass Co., Ltd.), and Troysol S-366 (produced by Troy Chemical Industries, Inc.); an organo-siloxane polymer, KP-341 (produced by Shin-Etsu Chemical Co., Ltd.); and acrylic acid-based or methacrylic acid-based (co)polymers Polyflow No. 75 and No. 95 (produced by Kyoeisha Yushi Kagaku Kogyo Co., Ltd.).

The amount of such a surfactant blended is usually 2 parts by mass or less, preferably 1 part by mass or less, per 100 parts by mass of the solid content in the positive resist composition of the present invention.

One of these surfactants may be used alone or several species thereof may be added in combination.

As for the surfactant, the composition preferably contains any one species of fluorine- and/or silicon-containing surfactants (a fluorine-containing surfactant, a silicon-containing surfactant or a surfactant containing both a fluorine atom and a silicon atom), or two or more species thereof.

Examples of these surfactants include the surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. The following commercially available surfactants each may also be used as it is.

Examples of the commercially available surfactant which can be used include a fluorine-containing or silicon-containing surfactant such as EFtop EF301 and EF303 (produced by Shin-Akita Chemical Co., Ltd.), Florad FC430 and 431 (produced by Sumitomo 3M Inc.), Megafac F171, F173, F176, F189 and R08 (produced by Dainippon Ink & Chemicals, Inc.), Surflon S-382, SC101, 102, 103, 104, 105 and 106 (produced by Asahi Glass Co., Ltd.), and Troysol S-366 (produced by Troy Chemical Industries, Inc.). In addition, a polysiloxane polymer KP-341 (produced by Shin-Etsu Chemical Co., Ltd.) may also be used as the silicon-containing surfactant.

Other than these known surfactants, a surfactant using a polymer having a fluoroaliphatic group derived from a fluoroaliphatic compound produced by a telomerization process (also called a telomer process) or an oligomerization process (also called an oligomer process) may be used. The fluoroaliphatic compound can be synthesized by the method described in JP-A-2002-90991.

The polymer having a fluoroaliphatic group is preferably a copolymer of a fluoroaliphatic group-containing monomer with a (poly(oxyalkylene)) acrylate and/or a (poly(oxyalkylene)) methacrylate, and the polymer may have an irregular distribution or may be a block copolymer. Examples of the poly(oxyalkylene) group include a poly(oxyethylene) group, a poly(oxypropylene) group and a poly(oxybutylene) group. This group may also be a unit having alkylenes differing in the chain length within the same chain, such as block-linked poly(oxyethylene, oxypropylene and oxyethylene) and block-linked poly(oxyethylene and oxypropylene). Furthermore, the copolymer of a fluoroaliphatic group-containing monomer with a (poly(oxyalkylene)) acrylate (or methacrylate) may be not only a binary copolymer but also a ternary or higher copolymer obtained by simultaneously copolymerizing two or more different fluoroaliphatic group-containing monomers or two or more different (poly(oxyalkylene)) acrylates (or methacrylates).

Examples thereof include commercially available surfactants such as Megafac F178, F-470, F-473, F-475, F-476 and F-472 (produced by Dainippon Ink & Chemicals, Inc.), and further include a copolymer of a $C_6F_{13}$ group-containing acrylate (or methacrylate) with a (poly(oxyalkylene)) acrylate (or methacrylate), a copolymer of a $C_6F_{13}$ group-containing acrylate (or methacrylate) with (poly(oxyethylene)) acrylate (or methacrylate) and (poly(oxypropylene)) acrylate (or methacrylate), a copolymer of a $C_8F_{17}$ group-containing acrylate (or methacrylate) with a (poly(oxyalkylene)) acrylate (or methacrylate), and a copolymer of a $C_8F_{17}$ group-containing acrylate (or methacrylate) with (poly(oxyethylene)) acrylate (or methacrylate) and (poly(oxypropylene)) acrylate (or methacrylate).

The amount of the surfactant used is preferably from 0.0001 to 2 mass %, more preferably from 0.001 to 1 mass %, based on the entire amount of the positive resist composition (excluding the solvent).

Other Components:

The positive resist composition of the present invention may further contain, if desired, a dye, a photobase generator and the like.

1. Dye

In the present invention, a dye may be used.

The suitable dye includes an oily dye and a basic dye. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (all produced by Orient Chemical Industries Co., Ltd.), Crystal Violet (CI42555), Methyl Violet (CI42535), Rhodamine B (CI45170B), Malachite Green (CI42000) and Methylene Blue (CI52015).

2. Photobase Generator

Examples of the photobase generator which can be added to the composition of the present invention include compounds described in JP-A-4-151156, JP-A-4-162040, JP-A-5-197148, JP-A-5-5995, JP-A-6-194834, JP-A-8-146608, JP-A-10-83079 and European Patent 622,682. Specific examples of the photobase generator which can be suitably used include 2-nitrobenzyl carbamate, 2,5-dinitrobenzylcyclohexyl carbamate, N-cyclohexyl-4-methylphenylsulfonamide and 1,1-dimethyl-2-phenylethyl-N-isopropyl carbamate. Such a photobase generator is added for the purpose of improving the resist profile or the like.

3. Solvents

The positive resist composition of the present invention after dissolving the components described above in a solvent is coated on a support. Usually, the concentration is, in terms of the solid content concentration of all resist components, preferably from 2 to 30 mass %, more preferably from 3 to 25 mass %.

Preferred examples of the solvent used here include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofuran. One of these solvents is used alone, or several species thereof are mixed and used.

The positive resist composition of the present invention is coated on a substrate to form a thin film. The thickness of this coated film is preferably from 0.05 to 4.0 μm.

The positive resist composition of the present invention has an excellent effect such that even when applied directly onto a substrate having not coated thereon an antireflection film and having a high-reflection surface, generation of stationary wave is greatly reduced and a good pattern is obtained, but also in the case of using an antireflection film, a good pattern can be formed. The antireflection film used as the underlayer of the resist may be either an inorganic film type such as titanium, titanium dioxide, titanium nitride, chromium oxide, carbon and amorphous silicon, or an organic film type comprising a light absorbent and a polymer material. The former requires equipment for the film formation, such as vacuum deposition apparatus, CVD apparatus and sputtering apparatus. Examples of the organic antireflection film include a film comprising a condensate of diphenylamine derivative and formaldehyde-modified melamine resin, an alkali-soluble resin and a light absorbent described in JP-B-7-69611 (the term "JP-B" as used herein means an "examined Japanese patent publication"), a reaction product of a maleic anhydride copolymer and a diamine-type light absorbent described in U.S. Pat. No. 5,294,680, a film containing a resin binder and a methylolmelamine-based heat crosslinking agent described in JP-A-6-118631, an acrylic resin-type antireflection film containing a carboxylic acid group, an epoxy group and a light absorbing group within the same molecule described in JP-A-6-118656, a film comprising a methylolmelamine and a benzophenone-based light absorbent described in JP-A-8-87115, and a film obtained by adding a low molecular light absorbent to a polyvinyl alcohol resin described in JP-A-8-179509.

Also, the organic antireflection film may be a commercially available organic antireflection film such as DUV-30 Series and DUV-40 Series produced by Brewer Science, Inc.; and AR-2, AR-3 and AR-5 produced by Shipley Co., Ltd.

In the production or the like of a precision integrated circuit device, the step of forming a pattern on a resist film is performed by coating the positive resist composition of the present invention on a substrate (for example, a silicon/silicon dioxide-coated substrate, a glass substrate, an ITO substrate or a quartz/chromium oxide-coated substrate) to form a resist film, irradiating thereon actinic rays or radiation such as KrF excimer laser light, electron beam or EUV light, and then subjecting the resist film to heating, development, rinsing and drying, whereby a good resist pattern can be formed.

The alkali developer which can be used in the development is an aqueous solution of alkalis (usually, 0.1 to 20 mass %) such as inorganic alkalis (e.g., sodium hydroxide, potassium hydroxide, sodium carbonate, sodium silicate, sodium metasilicate, aqueous ammonia), primary amines (e.g., ethylamine, n-propylamine), secondary amines (e.g., diethylamine, di-n-butylamine), tertiary amines (e.g., triethylamine, methyldiethylamine), alcohol amines (e.g., dimetylethanolamine, triethanolamine), quaternary ammonium salts (e.g., tetramethylammonium hydroxide, tetraethylammonium hydroxide, choline), and cyclic amines (e.g., pyrrole, piperidine). This aqueous solution of alkalis may be used after adding thereto alcohols such as isopropyl alcohol or a surfactant such as nonionic surfactant in an appropriate amount.

Among these developers, a quaternary ammonium salt is preferred, and tetramethylammonium hydroxide and choline are more preferred.

The pH of the alkali developer is usually from 10 to 15.

EXAMPLES

The present invention is described in greater detail below by referring to Examples, but the present invention should not be construed as being limited thereto.

Synthesis Example 1

Synthesis of Resin (B-17)

A copolymer of p-hydroxystyrene and tert-butyl methacrylate (molar compositional ratio: 80/20) (35.0 g) and propylene glycol monomethyl ether acetate (PGMEA) (400 g) were dissolved in a flask, and water and PGMEA was azeotropically removed by distillation under reduced pressure. After confirming that the water content was sufficiently reduced, triethylamine (5.0 g) was added. Subsequently, a solution prepared by dissolving 5.0 g of 2-naphthoyl chloride in 50 g of acetone was added over 20 minutes, and the reaction was allowed to proceed with stirring for 60 minutes. The reaction solution was subjected to liquid separation by adding water (400 ml) and ethyl acetate (800 ml) and then washed with water, and ethyl acetate, water and the azeotropic portion of PGMEA were removed by distillation under reduced pressure to obtain Resin (B-17) having a substituent according to the present invention (molar compositional ratio: 10/70/20, molecular weight: 13,000, dispersity: 1.7, 30% PGMEA solution).

Resins shown in Table 1 below were synthesized in the same manner.

TABLE 1

| | Molar Ratio of Repeating Units | Weight Average Molecular Weight | Dispersity |
| --- | --- | --- | --- |
| Resin (B-2) | 8/75/17 | 13000 | 1.7 |
| Resin (B-4) | 10/70/20 | 12000 | 1.8 |
| Resin (B-6) | 8/70/17/5 | 14000 | 1.9 |
| Resin (B-10) | 8/75/17 | 10000 | 1.8 |
| Resin (B-17) | 10/70/20 | 13000 | 1.7 |
| Resin (B-20) | 10/70/20 | 11000 | 1.8 |
| Resin (B-27) | 10/70/20 | 8200 | 1.7 |
| Resin (B-30) | 10/70/20 | 12200 | 1.9 |
| Resin (B-38) | 8/70/17/5 | 11600 | 1.7 |
| Resin (B-47) | 10/70/20 | 10600 | 1.9 |
| Resin (B-50) | 10/70/20 | 9200 | 1.7 |
| Resin (B-57) | 10/70/20 | 9800 | 1.9 |
| Resin (B-62) | 8/75/17 | 11000 | 1.7 |
| Resin (B-70) | 10/70/20 | 8300 | 1.8 |
| Resin (B-84) | 8/75/17 | 13000 | 1.9 |
| Resin (B-C) | 10/70/20 | 13000 | 1.7 |

The structure of Resin (B-C) is shown below.

Resin (B-C):

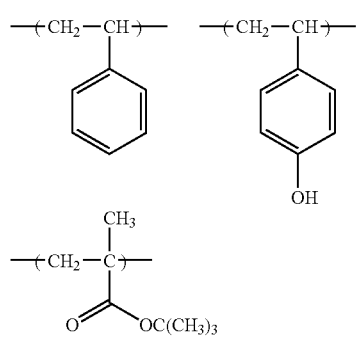

Examples 1 to 19 and Comparative Example 1

The components shown in Table 2 at a blending ratio (amounts added) shown in Table 2 were dissolved in a mixed solvent of PGMEA (propylene glycol monomethyl ether acetate)/PGME (propylene glycol monomethyl ether) (=8/2 by mass) to give a concentration of 10 mass %, and the obtained solution was filtered through a microfilter having a pore size of 0.1 μm to prepare positive resist solutions of Examples 1 to 19 and Comparative Example 1.

The obtained positive resist solution was coated on a bare silicon substrate by using a spin coater (Mark 8, manufactured by Tokyo Electron Ltd.) and dried at 90° C. for 90 seconds to form each resist film of 410 nm. Subsequently, the resist film was exposed using a KrF excimer laser (FPA-3000EX5, manufactured by Canon Inc., wavelength: 248 nm, NA=0.60, σ=0.75). After the exposure, the resist film was heated on a hot plate at 100° C. for 60 seconds, immediately dipped in an aqueous 0.26N tetramethylammonium hydroxide (TMAH) solution for 60 seconds, rinsed with water for 30 seconds, and dried. The thus-obtained pattern on the silicon wafer was observed through a scanning electron microscope to evaluate the performance of the resist.

[Resolving Power]

The limiting resolving power with an exposure dose for reproducing a 0.30-μm line-and-space (1:1) mask pattern is shown.

[Remaining of Stationary Wave]

The side wall of the resist pattern obtained using a 0.30-μm line-and-space (1:1) mask pattern was observed through a scanning electron microscope and evaluated on a scale of the following four stages.

A: Stationary wave is not observed at all and the pattern side wall is clean.

B: Stationary wave is slightly observed or irregularities are observed on the pattern side wall.

C: Stationary wave can be apparently confirmed.

D: Stationary wave can be very strongly confirmed.

[Iso-Dense Bias]

With respect to the line width at the limiting resolving power for a line-and-space pattern (dense pattern (1:1)), exposure was performed by 10% increasing the exposure dose based on the exposure dose for reproducing a 0.30-μm line-and-space (1:1) mask pattern and by 10% decreasing the exposure dose, and the absolute value (δx) of the difference between line widths obtained was determined. Also, exposure was performed in the same manner for an isolated pattern (sparse pattern (1:5)), and the absolute value (δy) of the difference between line widths was determined. The absolute value of the difference between δx and δy is used as the basis of evaluation of the iso-dense bias. A smaller value indicates better iso-dense bias.

[Development Defect]

Each resist film was coated on a 6-inch bare Si substrate to a thickness of 0.5 μm and dried on a vacuum suction-type hot plate at 130° C. for 60 seconds. Subsequently, the resist film was exposed through a test mask having a 0.35-μm contact hole pattern (hole/duty ratio=1/3) by means of Nikon Stepper NSR-1505EX and then post-exposure-baked at 130° C. for 90 seconds. Furthermore, the resist film was puddle-developed with 2.38% TMAH (aqueous tetramethylammonium hydroxide solution) for 60 seconds, rinsed with pure water for 30 seconds, and then spin-dried. The thus-obtained sample was measured on the number of development defects (development defect by KLA) by means of KLA-2112 manufactured by KLA Tencol, and the obtained primary data value was used as the number of development defects.

The evaluation results are shown in Table 2.

TABLE 2

| | Composition | | | | Evaluation Results | | | |
|---|---|---|---|---|---|---|---|---|
| | Resin (0.93 g) | Acid Generator (0.05 g) | Basic Compound (0.003 g) | Surfactant (0.001 g) | Resolving Power (μm) | Remaining of Stationary Wave | Development Defects | Iso-Dense Bias (nm) |
| Example 1 | B-2 | z34 | D-1 | W-1 | 0.15 | A | 32 | 10 |
| Example 2 | B-4 | z35 | D-2 | W-1 | 0.15 | A | 28 | 8 |
| Example 3 | B-6 | z36 | D-3 | W-2 | 0.14 | A | 30 | 10 |
| Example 4 | B-10 | z37 | D-1 | W-1 | 0.15 | A | 30 | 10 |
| Example 5 | B-17 | z38 | D-2 | W-1 | 0.14 | A | 28 | 8 |
| Example 6 | B-20 | z39 | D-2 | W-1 | 0.15 | A | 33 | 10 |
| Example 7 | B-27 | z2 | D-1 | W-1 | 0.16 | A | 39 | 12 |
| Example 8 | B-30 | z4 | D-2 | W-1 | 0.16 | A | 39 | 13 |
| Example 9 | B-38 | z4 | D-2 | W-1 | 0.15 | A | 39 | 13 |
| Example 10 | B-47 | z19 | D-2 | W-1 | 0.16 | A | 35 | 12 |
| Example 11 | B-50 | z17 | D-1 | W-1 | 0.15 | A | 40 | 12 |
| Example 12 | B-57 | z19 | D-2 | W-1 | 0.16 | A | 36 | 13 |
| Example 13 | B-62 | z19 | D-2 | W-1 | 0.16 | A | 45 | 13 |
| Example 14 | B-70 | z2 | D-1 | W-1 | 0.15 | A | 42 | 12 |
| Example 15 | B-84 | z4 | D-2 | W-1 | 0.15 | A | 48 | 13 |
| Example 16 | B-2 | z55 | D-1 | W-1 | 0.14 | A | 26 | 8 |
| Example 17 | B-2 | z59 | D-1 | W-1 | 0.14 | A | 25 | 8 |
| Example 18 | B-2 | z70 | D-1 | W-1 | 0.14 | A | 25 | 9 |
| Example 19 | B-2 | z71 | D-1 | W-1 | 0.14 | A | 28 | 9 |
| Comparative Example 1 | B-C | z17 | D-1 | W-1 | 0.18 | C | 120 | 20 |

Abbreviations in the Table are as follows.

[Basic Compound]

D-1: tetrabutylammonium hydroxide

D-2: dicyclohexylmethylamine

D-3: tris(methoxyethoxyethylamine)

[Surfactant]

W-1: fluorine-containing surfactant, Megafac F-176 (produced by Dainippon Ink & Chemicals, Inc.)

W-2: fluorine/silicon-containing surfactant, Megafac R08 (produced by Dainippon Ink & Chemicals, Inc.)

It is seen from Table 2 that the positive resist composition of the present invention is assured of high resolution, good performance in terms of defocus latitude depended on line pitch, and reduction in the development defect and stationary wave.

According to the present invention, a positive resist composition satisfying high resolution, good defocus latitude depended on line pitch, and reduction in the development defect and stationary wave, all at the same time even in an ultrafine region, particularly, in an ion injection step not using an antireflection film (BARC), and a pattern forming method using the composition can be provided.

The entire disclosure of each and every foreign patent application from which the benefit of foreign priority has been claimed in the present application is incorporated herein by reference, as if fully set forth.

What is claimed is:

1. A positive resist composition, comprising:
(B) a resin containing a repeating unit represented by formula (Ib), which decomposes under an action of an acid to increase a solubility of the resin (B) in an aqueous alkali solution; and
(A) a compound capable of generating an acid upon irradiation with actinic rays or radiation:

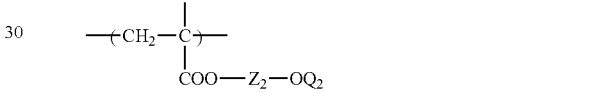

(Ib)

wherein in formula (Ib), X represents a hydrogen atom, a methyl group or a halogen atom;

$Q_2$ represents an arylcarbonyl group; and $Z_2$ represents a divalent linking group.

2. The positive resist composition according to claim 1, wherein the resin (B) further contains a repeating unit represented by formula (II):

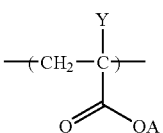

(II)

wherein Y represents a hydrogen atom, a methyl group, a halogen atom, a cyano group, a hydroxymethyl group, an alkoxymethyl group or an acyloxymethyl group; and A presents a group which leaves under an action of an acid.

3. The positive resist composition according to claim 1, wherein the resin (B) further contains a repeating unit represented by formula (III):

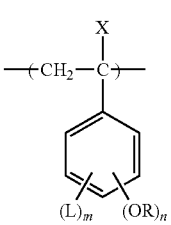

(III)

wherein X represents a hydrogen atom, a methyl group or a halogen atom;

R represents a hydrogen atom or a group which leaves under an action of an acid;

L represents a monovalent organic group, a halogen atom, a cyano group or a nitro group;

n represents an integer of 1 to 3; and m represents an integer of 0 to 2.

4. The positive resist composition according to claim 1, wherein the resin (B) further contains a repeating unit represented by formula (IV):

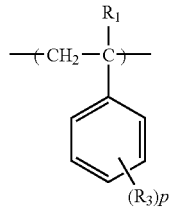

(IV)

wherein $R_1$ represents a hydrogen atom, an alkyl group, a cyano group or a halogen atom;

$R_3$ represents a monovalent organic group not having a property of decomposing under an action of an acid, or represents a halogen atom or a nitro group; and p represents an integer of 0 to 5, and when p is an integer of 2 or more, a plurality of $R_3$'s may be the same or different.

5. The positive resist composition according to claim 1, wherein the compound (A) capable of generating an acid upon irradiation with actinic rays or radiation is a diazosulfone or an oxime ester.

6. The positive resist composition according to claim 1, wherein the compound (A) capable of generating an acid upon irradiation with actinic rays or radiation is a sulfonium salt having bis(alkylsulfonyl)amide anion or tris(alkylsulfonyl)methide anion.

7. The positive resist composition according to claim 1, wherein the repeating unit represented by formula (Ib) in the resin (B) has a content of from 5 to 15 mol % based on all repeating units in the resin (B).

8. A pattern forming method, comprising:

forming a resist film from the positive resist composition according to claim 1; and exposing and developing the resist film.

9. A positive resist composition, comprising:

(B) a resin containing a repeating unit represented by formula (Ia), which decomposes under an action of an acid to increase a solubility of the resin (B) in an aqueous alkali solution; and (A) a compound capable of generating an acid upon irradiation with actinic rays or radiation:

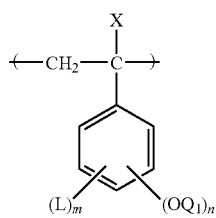

(Ia)

wherein in formula (Ia), X represents a hydrogen atom, a methyl group or a halogen atom;

$Q_1$ represents an arylcarbonyl group, and when n is 2 or 3, a plurality of $Q_1$'s may be the same of different;

L represents a monovalent organic group, a halogen atom, a cyano group or a nitro group, and when m is 2, two L's may be the same or different;

n represents an integer of 1 to 3; and m represents an integer of 0 to 2; and the resin B further contains a repeating unit represented by formula (II):

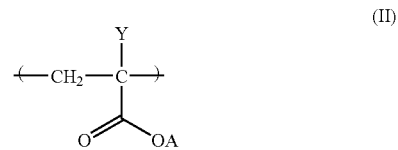

(II)

wherein Y represents a hydrogen atom, a methyl group, a halogen atom, a cyano group, a hydroxymethyl group, an alkoxymethyl group or an acyloxymethyl group; and A presents a group which leaves under an action of an acid.

10. The positive resist composition according to claim 9, wherein the resin (B) further contains a repeating unit represented by formula (III):

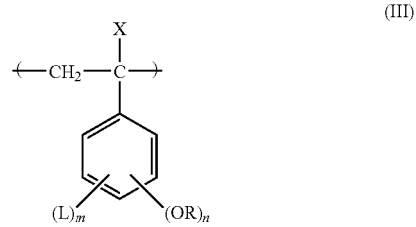

(III)

wherein X represents a hydrogen atom, a methyl group or a halogen atom;

R represents a hydrogen atom or a group which leaves under an action of an acid;

L represents a monovalent organic group, a halogen atom, a cyano group or a nitro group;

n represents an integer of 1 to 3; and m represents an integer of 0 to 2.

11. The positive resist composition according to claim 9, wherein the resin (B) further contains a repeating unit represented by formula (IV):

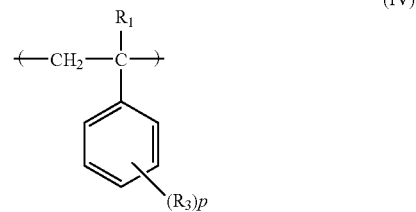

(IV)

wherein $R_1$ represents a hydrogen atom, an alkyl group, a cyano group or a halogen atom;

$R_3$ represents a monovalent organic group not having a property of decomposing under an action of an acid, or represents a halogen atom or a nitro group; and p represents an integer of 0 to 5, and when p is an integer of 2 or more, a plurality of $R_3$'s may be the same or different.

12. The positive resist composition according to claim 9, wherein the compound (A) capable of generating an acid upon irradiation with actinic rays or radiation is a diazosulfone or an oxime ester.

13. The positive resist composition according to claim 9, wherein the compound (A) capable of generating an acid upon irradiation with actinic rays or radiation is a sulfonium salt having a bis(alkylsulfonyl)amide anion or a tris(alkylsulfonyl)methide anion.

14. The positive resist composition according to claim 9, wherein the repeating unit represented by formula (Ia) in the resin (B) has a content of from 5 to 15 mol % based on all repeating units in the resin (B).

15. A pattern forming method, comprising:
forming a resist film from the positive resist composition according to claim 9; and exposing and developing the resist film.

16. A positive resist composition, comprising:
(B) a resin containing a repeating unit represented by formula (Ia), which decomposes under an action of an acid to increase a solubility of the resin (B) in an aqueous alkali solution; and
(A) a compound capable of generating an acid upon irradiation with actinic rays or radiation:

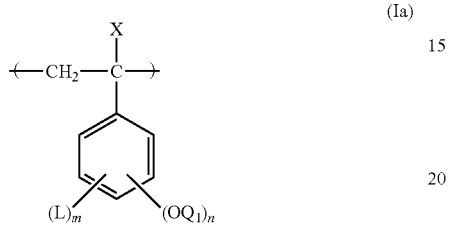

(Ia)

wherein in formula (Ia), X represents a hydrogen atom, a methyl group or a halogen atom;
$Q_1$ represents an arylcarbonyl group having a substituent, and when n is 2 or 3, a plurality of $Q_1$'s may be the same of different;
L represents a monovalent organic group, a halogen atom, a cyano group or a nitro group, and when m is 2, two L's may be the same or different;
n represents an integer of 1 to 3; and
m represents an integer of 0 to 2.

17. A positive resist composition, comprising:
(B) a resin containing a repeating unit represented by formula (Ia), which decomposes under an action of an acid to increase a solubility of the resin (B) in an aqueous alkali solution; and
(A) a compound capable of generating an acid upon irradiation with actinic rays or radiation:

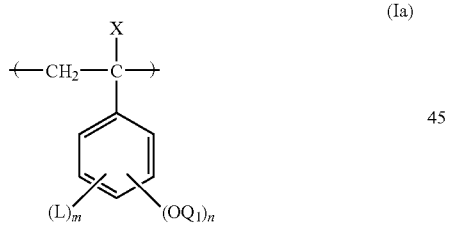

(Ia)

wherein in formula (Ia), X represents a hydrogen atom, a methyl group or a halogen atom;
$Q_1$ represents an arylcarbonyl group, and when n is 2 or 3, a plurality of $Q_1$'s may be the same of different and wherein the aryl moiety of the arylcarbonyl group is a naphthyl group or an anthranyl group;
L represents a monovalent organic group, a halogen atom, a cyano group or a nitro group, and when m is 2, two L's may be the same or different;
n represents an integer of 1 to 3; and
m represents an integer of 0 to 2.

18. A positive resist composition, comprising:
(B) a resin containing a repeating unit represented by formula (Ia), which decomposes under an action of an acid to increase a solubility of the resin (B) in an aqueous alkali solution; and
(A) a compound capable of generating an acid upon irradiation with actinic rays or radiation:

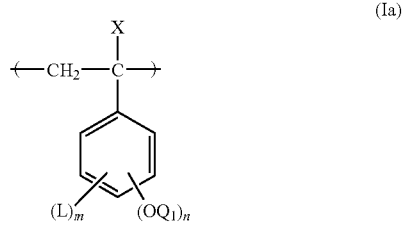

(Ia)

wherein in formula (Ia), X represents a hydrogen atom, a methyl group or a halogen atom;
$Q_1$ represents an arylcarbonyl group, and when n is 2 or 3, a plurality of $Q_1$'s may be the same of different;
L represents a monovalent organic group, a halogen atom, a cyano group or a nitro group, and when m is 2, two L's may be the same or different;
n represents an integer of 1 to 3; and
m represents an integer of 1 or 2.

19. A pattern forming method, comprising:
forming a resist film from the positive resist composition according to claim 16; and exposing and developing the resist film.

20. A pattern forming method, comprising:
forming a resist film from the positive resist composition according to claim 17; and exposing and developing the resist film.

21. A pattern forming method, comprising:
forming a resist film from the positive resist composition according to claim 18; and exposing and developing the resist film.

\* \* \* \* \*